(12) United States Patent  (10) Patent No.: US 8,838,402 B2
Wahlroos et al.  (45) Date of Patent: Sep. 16, 2014

(54) METHOD AND ARRANGEMENT FOR VOLTAGE MEASUREMENT

(71) Applicant: ABB Technology AG, Zürich (CH)

(72) Inventors: Ari Wahlroos, Vaasa (FI); Janne Altonen, Toijala (FI); Pentti Mähönen, Vaasa (FI)

(73) Assignee: ABB Technology AG, Zurich (CH)

( * ) Notice: Subject to any disclaimer, the term of this patent is extended or adjusted under 35 U.S.C. 154(b) by 164 days.

(21) Appl. No.: 13/647,548

(22) Filed: Oct. 9, 2012

(65) Prior Publication Data

US 2013/0035886 A1    Feb. 7, 2013

Related U.S. Application Data

(63) Continuation of application No. PCT/EP2011/055708, filed on Apr. 12, 2011.

(30) Foreign Application Priority Data

Apr. 14, 2010 (EP) ..................... 10159871

(51) Int. Cl.
G01R 19/00 (2006.01)
G06F 11/30 (2006.01)

(52) U.S. Cl.
USPC .................. 702/64; 702/63; 702/65; 702/182

(58) Field of Classification Search
CPC ................................ G01R 27/16; G01R 35/02
USPC ...................... 702/63–65, 117–126
See application file for complete search history.

(56) References Cited

U.S. PATENT DOCUMENTS 3,916,310 A    10/1975   Stark et al.
4,276,510 A    6/1981    Tompkins et al.
(Continued)

FOREIGN PATENT DOCUMENTS

WO    WO 2009/091803 A1    7/2009

OTHER PUBLICATIONS

International Search Report (PCT/ISA/210) issued on May 30, 2011, by the European Patent Office as the International Searching Authority for International Application No. PCT/EP2011/055708.
Written Opinion (PCT/ISA/237) issued on May 30, 2011, by the Japanese Patent Office as the International Searching Authority for International Application No. PCT/EP2011/055708.

(Continued)

Primary Examiner — Phuong Huynh
(74) Attorney, Agent, or Firm — Buchanan Ingersoll & Rooney PC

(57) ABSTRACT

A method and an arrangement for voltage measurement with a transformer configuration comprising three single pole voltage transformers having tertiary windings open-delta connected with each other. The arrangement is configured to apply a correction to measured secondary voltages on the basis of one or more parameters of the voltage transformers and/or one or more quantities in a known relation to one or more parameters of the voltage transformers, one or more parameters of a circuit connected to the secondary windings and/or one or more quantities in a known relation to one or more parameters of the circuit connected to the secondary windings, and one or more parameters of a circuit connected to the tertiary windings and/or one or more quantities in a known relation to one or more parameters of the circuit connected to the tertiary windings.

18 Claims, 4 Drawing Sheets

(56) References Cited

U.S. PATENT DOCUMENTS

2009/0184703 A1* 7/2009 Larson .......................... 323/356
2009/0219007 A1   9/2009 Ushijima
2009/0254297 A1* 10/2009 Bengtsson et al. ............ 702/117

OTHER PUBLICATIONS

European Search Report issued on Oct. 14, 2010 for European Application No. 10159871.2.

* cited by examiner

METHOD AND ARRANGEMENT FOR VOLTAGE MEASUREMENT

RELATED APPLICATIONS

This application claims priority as a continuation application under 35 U.S.C. §120 to PCT/EP2011/055708, which was filed as an International Application on Apr. 12, 2011 designating the U.S., and which claims priority to European Application 10159871.2 filed in Europe on Apr. 14, 2010. The entire contents of these applications are hereby incorporated by reference in their entireties.

FIELD

The present disclosure relates to voltage measurement.

BACKGROUND INFORMATION

Single pole insulated voltage transformers used in electricity distribution networks may be equipped with three windings. In addition to a primary winding, transformers have a secondary winding, for example, a measuring winding, which is used for either measuring or protection purposes, and a tertiary winding, for example, an earth-fault winding, which is utilized for earth-fault protection purposes. The terminals of the primary, measuring and earth-fault windings are generally denoted as: A-N, a-n and da-dn, respectively. FIG. 1 shows a terminal diagram of a single pole insulated voltage transformer with three windings. It is known for all three windings to be wound around the same magnetic (iron) core. FIG. 2 illustrates a principal construction of an exemplary single pole insulated voltage transformer with three windings, including a primary winding 20, an earth-fault winding 30 and a measuring winding 40, which are wound around a core 50 and enclosed in a housing 60. The fact that all the windings 20, 30, 40 are wound around the same magnetic core 50 makes the windings interlinked through magnetic fluxes. Consequently, when a primary voltage is applied to the primary winding 20, the secondary windings 30, 40 produce secondary voltages that depend on the primary voltage and a turns-ratio between the secondary winding in question and the primary winding.

In a three-phase network, the earth-fault windings of three single pole insulated voltage transformers may be connected in an "open-delta" connection. This is due to the fact that during an earth-fault in the primary network, the voltage between the open-delta terminals is related to a residual voltage of the network (voltage between earth and neutral point of the three-phase system). This voltage is utilized in earth-fault protection relays. In addition, a resistor may be connected between open-delta terminals in order to provide necessary damping power in case of ferro-resonance. FIG. 3 shows a known configuration of three single pole insulated voltage transformers 11, 12, 13 each with primary windings 21, 22, 23, measuring windings 41, 42, 43 and earth-fault windings 31, 32, 33 connected to phases PA, PB, PC of a three-phase network. Earth-fault windings 31, 32, 33 of the three single pole insulated voltage transformers 11, 12, 13 are connected in open-delta connection. A resistor Rd is connected between open-delta terminals in order to provide necessary damping power in case of ferro-resonance. The primary voltages of the three phases PA, PB, PC of the three-phase network may then be obtained on the basis of the secondary voltages measured from the measuring windings 41, 42, 43 and the turns-ratio between the primary winding and the measuring winding. However, due to various non-idealities of the transformers, the primary voltages obtained merely on the basis of measured secondary voltages and the turns-ratio between the primary winding and the secondary winding may not accurately correspond to true primary voltages.

WO 2009/091803 discloses a transformer with two secondary windings. In WO 2009/091803, the transformer includes a compensation circuit which includes a current transformer and an impedance in order to improve an accuracy of a metering voltage by compensating for a voltage drop across primary winding incurred by a load current of a power load connected to a secondary winding. A drawback of the disclosed solution is that it requires an additional current transformer and an impedance to be added to the transformer structure.

SUMMARY

An exemplary embodiment of the present disclosure provides a method for voltage measurement with a transformer configuration including three single pole voltage transformers each respectively having a primary winding, a secondary winding and a tertiary winding, wherein the primary windings are connected to primary voltages and the tertiary windings of the voltage transformers are open-delta connected with each other. The exemplary method includes measuring secondary voltages from the secondary windings, and determining values of the primary voltages on the basis of the secondary voltages measured from the secondary windings and a turns-ratio between the primary winding and the secondary winding. The determining of the values of the primary voltages includes applying a correction to the measured secondary voltages on the basis of: at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

An exemplary embodiment of the present disclosure provides a non-transitory computer-readable recording medium having a computer program recorded thereon that, when executed, causes a processor of a computer processing device to carry out operations for voltage measurement with a transformer configuration including three single pole voltage transformers each respectively having a primary winding, a secondary winding and a tertiary winding, wherein the primary windings are connected to primary voltages and the tertiary windings of the voltage transformers are open-delta connected with each other. The operations include measuring secondary voltages from the secondary windings, determining values of the primary voltages on the basis of the secondary voltages measured from the secondary windings and a turns-ratio between the primary winding and the secondary winding. The determining of the values of the primary voltages includes applying a correction to the measured secondary voltages on the basis of: at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

An exemplary embodiment of the present disclosure provides an arrangement for voltage measurement with a transformer configuration including three single pole voltage transformers each respectively having at least a primary winding, a secondary winding and a tertiary winding, wherein the primary windings are arranged to be connected to primary voltages, and the tertiary windings of the voltage transformers are open-delta connected with each other. The exemplary arrangement includes means for determining values of the primary voltages on the basis of secondary voltages measured from the secondary windings and a turns-ratio between the primary winding and the secondary winding. The means for determining the values of the primary voltages are configured to apply a correction to the measured secondary voltages on the basis of: at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

An apparatus for voltage measurement with a transformer con-figuration including three single pole voltage transformers each respectively having at least a primary winding, a secondary winding and a tertiary winding, wherein the primary windings are arranged to be connected to primary voltages, and the tertiary windings of the voltage transformers are open-delta connected with each other. The exemplary apparatus is configured to determine values of the primary voltages on the basis of secondary voltages measured from the secondary windings and a turns-ratio between the primary winding and the secondary winding. The exemplary apparatus is also configured to apply a correction to the measured secondary voltages, when determining the values of the primary voltages, on the basis of: at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

An exemplary embodiment of the present disclosure provides an apparatus for voltage measurement with a transformer configuration comprising three single pole voltage transformers each having at least a primary winding, a secondary winding and a tertiary winding, wherein the primary windings are arranged to be connected to primary voltages and the tertiary windings of the voltage transformers are open-delta connected with each other. The exemplary apparatus includes a processor, and a memory storing instructions that, when executed by the processor, cause the apparatus to: determine values of the primary voltages on the basis of the secondary voltages measured from the secondary windings and a turns-ratio between the primary winding and the secondary winding, and apply a correction to the measured secondary voltages, when determining the values of the primary voltages, on the basis of: at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a method and an apparatus for implementing the method so as to overcome the aforementioned drawback or at least to alleviate it. Exemplary embodiments of the present disclosure provide a method, an arrangement, and a non-transitory computer-readable recording medium having a computer program recorded thereon that causes a processor of a computer processing device to carry out the method.

Exemplary embodiments of the present disclosure are based on the idea of applying a correction to the measured secondary voltages on the basis of one or more parameters of the voltage transformers and/or one or more quantities in a known relation to one or more parameters of the voltage transformers, one or more parameters of a circuit connected to the secondary windings and/or one or more quantities in known relation to one or more parameters of the circuit connected to the secondary windings, and one or more parameters of a circuit connected to the tertiary windings and/or one or more quantities in a known relation to one or more parameters of the circuit connected to the tertiary windings.

In accordance with an exemplary embodiment of the method and arrangement of the present disclosure, the measured secondary voltages can be corrected to take into account the parameters of the transformers, external wiring and/or burdens, for example. After the correction the secondary voltages better correspond to the true primary voltages. The disclosure does not require any changes to the transformer structure itself.

The application of the present disclosure is not limited to any specific system, but it can be used in connection with various electric systems. Moreover, the use of the present disclosure is not limited to systems or devices employing any specific fundamental frequency or any specific voltage level.

According to an exemplary embodiment, secondary voltages are measured from the secondary windings 41, 42, 43 and values of the primary voltages are determined on the basis of the measured secondary voltages. The determining of the values of the primary voltages then may include applying a correction to the measured secondary voltages on the basis of (i) one or more parameters of the voltage transformers and/or one or more quantities in a known relation to one or more parameters of the voltage transformers, (ii) one or more parameters of a circuit connected to the secondary windings and/or one or more quantities in a known relation to one or more parameters of the circuit connected to the secondary windings, and (iii) one or more parameters of a circuit connected to the tertiary windings and/or one or more quantities in a known relation to one or more parameters of the circuit connected to the tertiary windings.

Figure 1:
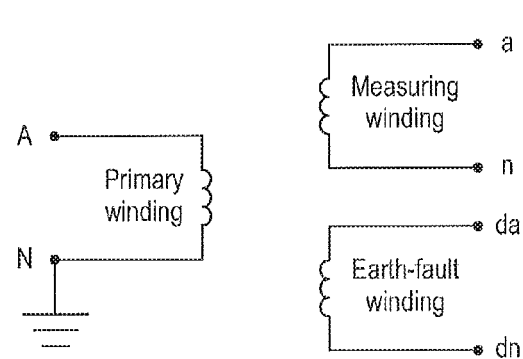
FIG. 1 shows a terminal diagram of a single pole insulated voltage transformer with three windings.
Figure 2:
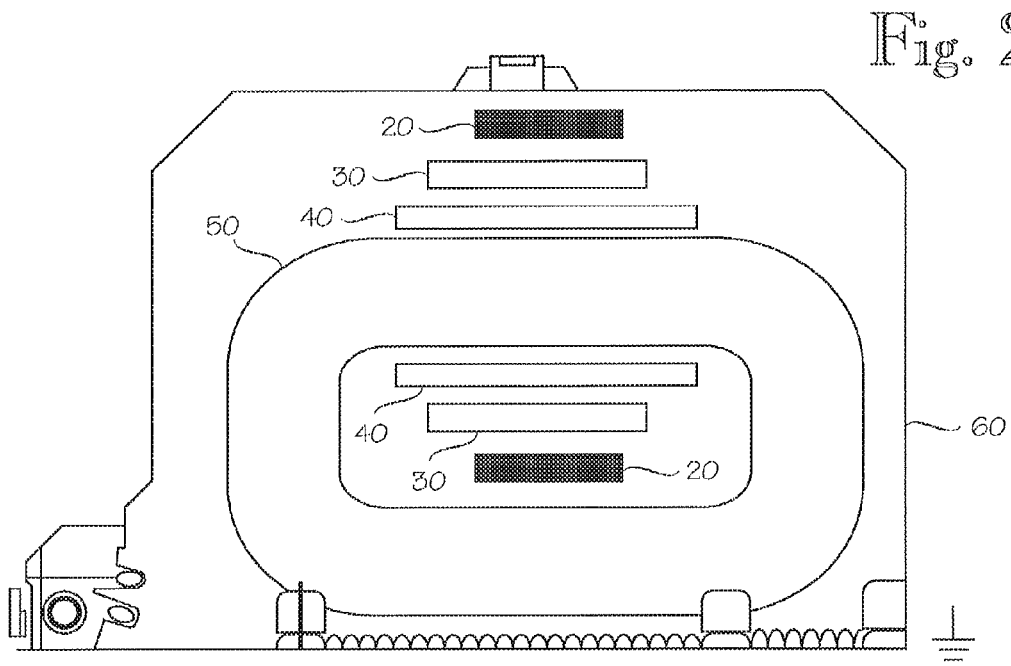
FIG. 2 shows a principal construction of a single pole insulated voltage transformer with three windings.
Figure 3:
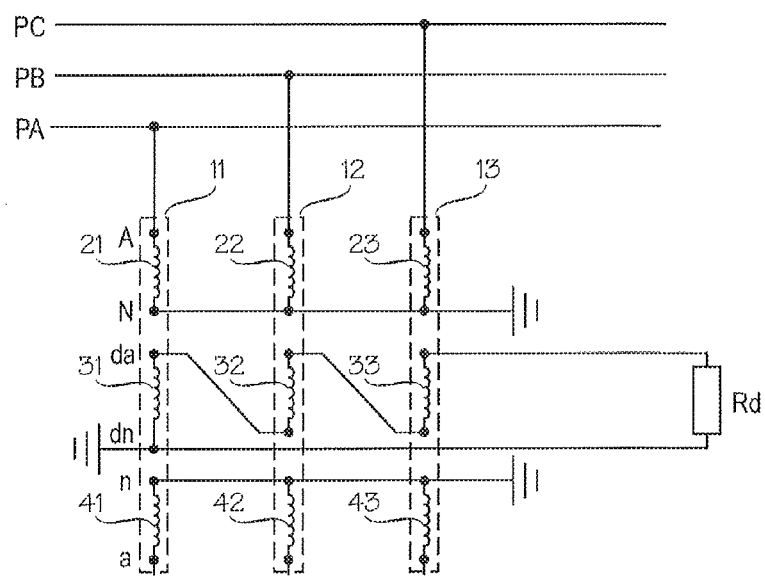
FIG. 3 shows a configuration of three single pole insulated voltage transformers each with three windings.
Figure 4:
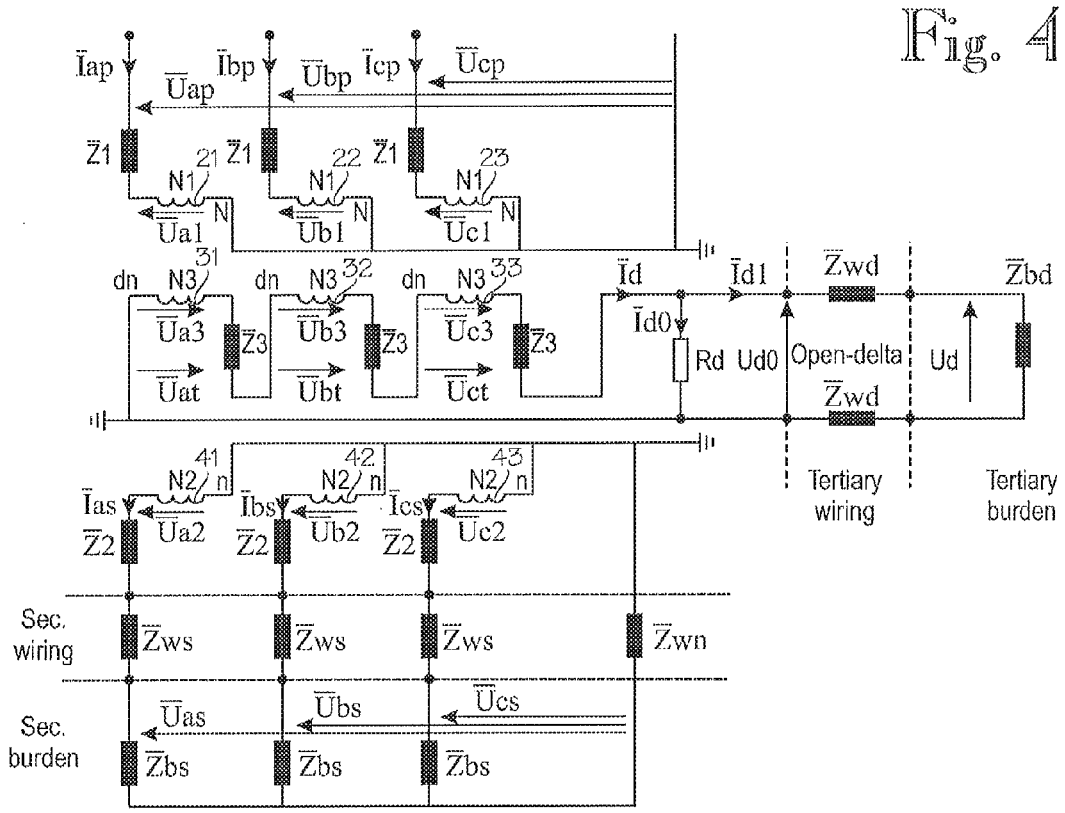
FIG. 4 shows an equivalent circuit of three single pole instrument voltage transformers where secondary burden is star-connected, according to an exemplary embodiment of the present disclosure.
Figure 5:
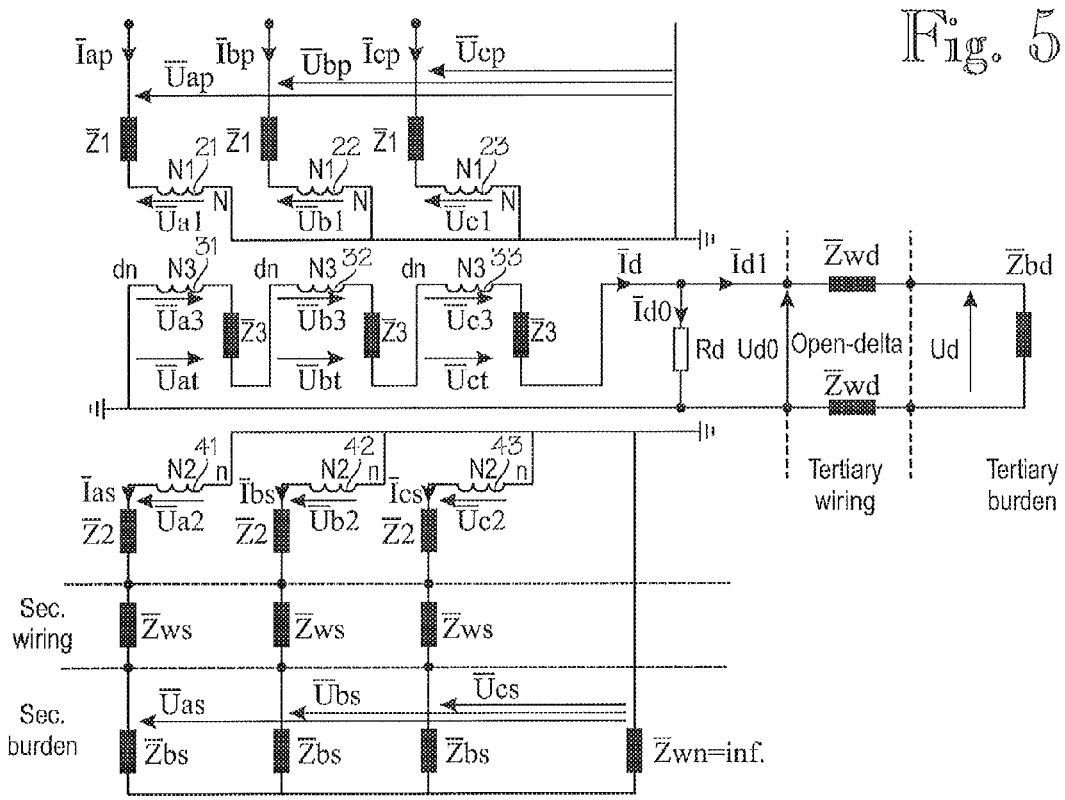
FIG. 5 shows an equivalent circuit of three single pole instrument voltage transformers where secondary burden is delta-connected (after delta-star conversion) according to an exemplary embodiment of the present disclosure.

In order to analyze the behavior of an exemplary configuration of three single pole insulated voltage transformers with three windings in a three-phase network, the electrical equivalent schemes of FIGS. 4 and 5 can be derived.

The secondary burden (impedance $\overline{Z}bs$) is connected to the transformers' secondary (measuring) winding 41, 42, 43 terminals. The connection is made through wiring impedance $\overline{Z}ws$. FIG. 4 illustrates a star-connected burden, where the common neutral conductor is modeled with wiring impedance $\overline{Z}wn$. The equivalent scheme presented in FIG. 5 can be used in case the burden is delta connected. In this case, the neutral conductor impedance $Zwn$ equals infinity. $Zbs$ values can be obtained using delta-star conversion for impedances.

The tertiary (earth-fault) windings 31, 32, 33 are connected in an "open-delta" configuration for earth fault protection purposes. Resistor Rd is connected between open-delta terminals in order to prevent ferro-resonance. Tertiary burden (impedance $\overline{Z}bd$) is connected to transformers' tertiary terminals. The connection is made through wiring impedance $Zwd$.

Notations used in FIGS. 4 and 5:
$Uap$=Phase PA primary phase-to-earth voltage
$Ubp$=Phase PB primary phase-to-earth voltage
$Ucp$=Phase PC primary phase-to-earth voltage
$Uas$=Phase PA secondary phase-to-earth voltage
$Ubs$=Phase PB secondary phase-to-earth voltage
$Ucs$=Phase PC secondary phase-to-earth voltage
$Uat$=Phase PA tertiary phase-to-earth voltage
$Ubt$=Phase PB tertiary phase-to-earth voltage
$Uct$=Phase PC tertiary phase-to-earth voltage
$Z1$=Impedance of the primary winding
$Z2$=Impedance of the secondary winding
$Z3$=Impedance of the tertiary winding
$Zws$=Secondary wiring impedance
$Zwn$=Wiring impedance of the neutral conductor of the secondary burden
$Zwd$=Tertiary wiring impedance
$Zbs$=Secondary burden impedance
$Zbd$=Tertiary burden impedance
$Rd$=Ferro-resonance damping resistance
$N1$=Number of turns of wire in the primary winding
$N2$=Number of turns of wire in the secondary winding
$N3$=Number of turns of wire in the tertiary winding
$\bar{I}ap$=Phase PA primary phase current
$\bar{I}bp$=Phase PB primary phase current
$\bar{I}cp$=Phase PC primary phase current
$\bar{I}as$=Phase PA secondary phase current
$\bar{I}bs$=Phase PB secondary phase current
$\bar{I}cs$=Phase PC secondary phase current
$\overline{U}a1$=Voltage over the primary winding, phase PA
$\overline{U}b1$=Voltage over the primary winding, phase PB
$\overline{U}c1$=Voltage over the primary winding, phase PC
$\overline{U}a2$=Voltage over the secondary winding, phase PA
$\overline{U}b2$=Voltage over the secondary winding, phase PB
$\overline{U}c2$=Voltage over the secondary winding, phase PC
$\overline{U}a3$=Voltage over the tertiary winding, phase PA
$\overline{U}b3$=Voltage over the tertiary winding, phase PB
$\overline{U}c3$=Voltage over the tertiary winding, phase PC
$\bar{I}d0$=Tertiary current through the damping resistor
$\bar{I}d1$=Tertiary current through the tertiary burden
$\bar{I}d$=Total tertiary current
$\overline{U}d$=Open-delta voltage
$\overline{U}d0$=Voltage over the damping resistor=$\overline{U}at+\overline{U}bt+\overline{U}ct$ The transformers are modeled with their respective longitudinal impedances $\overline{Z}1$, $\overline{Z}2$ and $\overline{Z}3$, which include a winding resistance and a leakage reactance. These are assumed to be similar for each phase transformer. Values for $\overline{Z}1$, $\overline{Z}2$ and $\overline{Z}3$ can be derived from short-circuit test results or obtained from the manufacturer of the transformer, for example. The effect of an external cabling/wiring for instrumentation can be taken into account by wiring impedances $\overline{Z}ws$, $\overline{Z}wn$ and $\overline{Z}wd$. Burden can be taken into account with impedances $\overline{Z}bs$ and $\overline{Z}bd$. From FIGS. 4 and 5, the following equations can be written (equations with "a" apply for FIG. 4, while equations with "b" apply for FIG. 5):

Phase a:

$$\overline{U}ap - \overline{Z}1 * \bar{I}ap = \overline{U}a1 \quad (eq\ 1)$$

$$\overline{U}a2 - (\overline{Z}2 + \overline{Z}ws) * \bar{I}as = \overline{U}as + \overline{Z}wn * (\bar{I}as + \bar{I}bs + \bar{I}cs) \quad (eq\ 2a)$$

$$\overline{U}a2 - (\overline{Z}2 + \overline{Z}ws) * \bar{I}as = \overline{U}as \quad (eq\ 2b)$$

$$\overline{U}a3 - \overline{Z}3 * \bar{I}d = \overline{U}at \quad (eq\ 3)$$

$$N1 * \bar{I}ap = N2 * \bar{I}as + N3 * \bar{I}d \quad (eq\ 4)$$

$$\overline{U}as = \overline{Z}bs * \bar{I}as \quad (eq\ 5a)$$

$$\overline{U}as = \overline{Z}bs * \bar{I}as + \overline{Z}wn * (\bar{I}as + \bar{I}bs + \bar{I}cs) \quad (eq\ 5b)$$

$$\overline{U}a2 = (N2/N1) * \overline{U}a1 \quad (eq\ 6)$$

$$\overline{U}a3 = (N3/N1) * \overline{U}a1 \quad (eq\ 7)$$

Phase b:

$$\overline{U}bp - \overline{Z}1 * \bar{I}bp = \overline{U}b1 \quad (eq\ 8)$$

$$\overline{U}b2 - (\overline{Z}2 + \overline{Z}ws) * \bar{I}bs = \overline{U}bs + \overline{Z}wn * (\bar{I}as + \bar{I}bs + \bar{I}cs) \quad (eq\ 9a)$$

$$\overline{U}b2 - (\overline{Z}2 + \overline{Z}ws) * \bar{I}bs = \overline{U}bs \quad (eq\ 9b)$$

$$\overline{U}b3 - \overline{Z}3 * \bar{I}d = \overline{U}bt \quad (eq\ 10)$$

$$N1 * \bar{I}bp = N2 * \bar{I}bs + N3 * \bar{I}d \quad (eq\ 11)$$

$$\overline{U}bs = \overline{Z}bs * \bar{I}bs \quad (eq\ 12a)$$

$$\bar{U}bs = \bar{Z}bs * \bar{I}bs + \bar{Z}wn * (\bar{I}as + \bar{I}bs + \bar{I}cs) \quad \text{(eq 12b)}$$

$$\bar{U}b2 = (N2/N1) * \bar{U}b1 \quad \text{(eq 13)}$$

$$\bar{U}b3 = (N3/N1) * \bar{U}b1 \quad \text{(eq 14)}$$

Phase c:

$$\bar{U}cp - \bar{Z}1 * \bar{I}cp = \bar{U}c1 \quad \text{(eq 15)}$$

$$\bar{U}c2 - (\bar{Z}2 + \bar{Z}ws) * \bar{I}cs = \bar{U}cs + \bar{Z}wn * (\bar{I}as + \bar{I}bs + \bar{I}cs) \quad \text{(eq 16a)}$$

$$\bar{U}c2 - (\bar{Z}2 + \bar{Z}ws) * \bar{I}cs = \bar{U}cs \quad \text{(eq 16b)}$$

$$\bar{U}c3 - \bar{Z}3 * \bar{I}d = \bar{U}ct \quad \text{(eq 17)}$$

$$N1 * \bar{I}cp = N2 * \bar{I}cs + N3 * \bar{I}d \quad \text{(eq 18)}$$

$$\bar{U}cs = \bar{Z}bs * \bar{I}cs \quad \text{(eq 19a)}$$

$$\bar{U}cs = \bar{Z}bs * \bar{I}cs + \bar{Z}wn * (\bar{I}as + \bar{I}bs + \bar{I}cs) \quad \text{(eq 19b)}$$

$$\bar{U}c2 = (N2/N1) * \bar{U}c1 \quad \text{(eq 20)}$$

$$\bar{U}c3 = (N3/N1) * \bar{U}c1 \quad \text{(eq 21)}$$

And $$\bar{I}d0 * Rd = (\bar{U}at + \bar{U}bt + \bar{U}ct) \quad \text{(eq 22)}$$

$$\bar{I}d0 * Rd - \bar{Z}wd * \bar{I}d1 = (\bar{Z}bd + \bar{Z}wd) * \bar{I}d1 \quad \text{(eq 23)}$$

$$\bar{I}d = \bar{I}d0 + \bar{I}d1 \quad \text{(eq 24)}$$

In equations 1 to 24, the known voltages are assumed to be:
$\bar{U}as$=Phase PA secondary phase-to-earth voltage
$\bar{U}bs$=Phase PB secondary phase-to-earth voltage
$\bar{U}cs$=Phase PC secondary phase-to-earth voltage The known impedances and transformer-related values are:
$\bar{Z}1$=Impedance of the primary winding
$\bar{Z}2$=Impedance of the secondary winding
$\bar{Z}3$=Impedance of the tertiary winding
$\bar{Z}ws$=Wiring impedance of the secondary circuit
$\bar{Z}wn$=Wiring impedance of the secondary circuit, neutral conductor
$\bar{Z}wd$=Wiring impedance of the open delta
$\bar{Z}bs$=Secondary burden impedance
$\bar{Z}bd$=Tertiary burden impedance
$Rd$=Ferro-resonance damping resistance
$N1$=Number of turns of wire in the primary winding
$N2$=Number of turns of wire in the secondary winding
$N3$=Number of turns of wire in the tertiary winding All other voltages and currents can be calculated as a function of secondary phase-to-earth voltage and known impedances and transformer-related values. Thus, accurate primary phase-to-earth voltages can be obtained.

In case the secondary burden is star-connected and the common neutral conductor wiring impedance is $\bar{Z}wn$ (refer to FIG. 4), equations 25-27 apply:

$$\begin{aligned}
\bar{U}ap = & 1/N2/\bar{Z}bs * (3 * N1^2 * \bar{Z}wn * \bar{U}as * Rd * \bar{Z}3 + 6 * N1^2 * \\
& \bar{Z}wn * \bar{U}as * \bar{Z}3 * \bar{Z}wd + 3 * N1^2 * \bar{Z}wn * \bar{U}as * \bar{Z}3 * \\
& \bar{Z}bd + 2 * N1^2 * \bar{Z}wn * \bar{U}as * Rd * \bar{Z}wd + N1^2 * \bar{Z}wn * \\
& \bar{U}as * Rd * \bar{Z}bd + 3 * N1^2 * \bar{Z}wn * \bar{U}bs * Rd * \\
& \bar{Z}3 + 6 * N1^2 * \bar{Z}wn * \bar{U}bs * \bar{Z}3 * \bar{Z}wd + 3 * N1^2 * \bar{Z}wn * \\
& \bar{U}bs * \bar{Z}3 * \bar{Z}bd + 2 * N1^2 * \bar{Z}wn * \bar{U}bs * Rd * \bar{Z}wd + N1^2 * \\
& \bar{Z}wn * \bar{U}bs * Rd * \bar{Z}bd + 3 * N1^2 * \bar{Z}wn * \bar{U}cs * Rd * \\
& \bar{Z}3 + 6 * N1^2 * \bar{Z}wn * \bar{U}cs * \bar{Z}3 * \bar{Z}wd + 3 * N1^2 * \bar{Z}wn * \\
& \bar{U}cs * \bar{Z}3 * \bar{Z}bd + 2 * N1^2 * \bar{Z}wn * \bar{U}cs * Rd * \bar{Z}wd + N1^2 * \\
& \bar{Z}wn * \bar{U}cs * Rd * \bar{Z}bd + 2 * \bar{Z}1 * N3^2 * \bar{Z}wd * \bar{U}bs * \\
& \bar{Z}bs + 3 * \bar{Z}1 * N3^2 * \bar{Z}bd * \bar{Z}wn * \bar{U}bs + \bar{Z}1 * N3^2 * \bar{Z}bd * \\
& \bar{U}as * \bar{Z}ws + 3 * \bar{Z}1 * N3^2 * \bar{Z}bd * \bar{Z}wn * \bar{U}as + \bar{Z}1 * N3^2 * \\
& \bar{Z}bd * \bar{U}as * \bar{Z}2 + \bar{Z}1 * N3^2 * \bar{Z}bd * \bar{U}as * \bar{Z}bs + \\
& \bar{Z}1 * N3^2 * Rd * \bar{U}as * \bar{Z}bs + 6 * \bar{Z}1 * N3^2 * \bar{Z}wd * \bar{Z}wn * \\
& \bar{U}cs + 3 * \bar{Z}1 * N3^2 * \bar{Z}bd * \bar{Z}wn * \bar{U}cs + \bar{Z}1 * N3^2 * \bar{Z}bd * \\
& \bar{U}bs * \bar{Z}2 + \bar{Z}1 * N3^2 * \bar{Z}bd * \bar{U}cs * \bar{Z}2 + \bar{Z}1 * N3^2 * \bar{Z}bd * \\
& \bar{U}cs * \bar{Z}ws + \bar{Z}1 * N3^2 * \bar{Z}bd * \bar{U}cs * \bar{Z}bs + \bar{Z}1 * N3^2 * \\
& \bar{Z}bd * \bar{U}bs * \bar{Z}ws + \bar{Z}1 * N3^2 * \bar{Z}bd * \bar{U}bs * \bar{Z}bs + \\
& \bar{Z}1 * N3^2 * Rd * \bar{U}as * \bar{Z}2 + \bar{Z}1 * N3^2 * Rd * \bar{U}as * \bar{Z}ws + 3 * \\
& \bar{Z}1 * N3^2 * Rd * \bar{Z}wn * \bar{U}as + 3 * \bar{Z}1 * N3^2 * Rd * \bar{Z}wn * \\
& \bar{U}bs + 3 * \bar{Z}1 * N3^2 * Rd * \bar{Z}wn * \bar{U}cs + \bar{Z}1 * N3^2 * Rd * \\
& \bar{U}bs * \bar{Z}2 + \bar{Z}1 * N3^2 * Rd * \bar{U}cs * \bar{Z}2 + \bar{Z}1 * N3^2 * Rd * \\
& \bar{U}cs * \bar{Z}ws + \bar{Z}1 * N3^2 * Rd * \bar{U}cs * \bar{Z}bs + \bar{Z}1 * N3^2 * Rd * \\
& \bar{U}bs * \bar{Z}ws + \bar{Z}1 * N3^2 * Rd * \bar{U}bs * \bar{Z}bs + 2 * \bar{Z}1 * N3^2 * \\
& \bar{Z}wd * \bar{U}as * \bar{Z}2 + 2 * \bar{Z}1 * N3^2 * \bar{Z}wd * \bar{U}as * \bar{Z}ws + 2 * \\
& \bar{Z}1 * N3^2 * \bar{Z}wd * \bar{U}as * \bar{Z}bs + 6 * \bar{Z}1 * N3^2 * \bar{Z}wd * \bar{Z}wn * \\
& \bar{U}as + 6 * \bar{Z}1 * N3^2 * \bar{Z}wd * \bar{Z}wn * \bar{U}bs + 2 * \bar{Z}1 * N3^2 * \\
& \bar{Z}wd * \bar{U}bs * \bar{Z}2 + 2 * \bar{Z}1 * N3^2 * \bar{Z}wd * \bar{U}cs * \bar{Z}ws + 2 * \\
& \bar{Z}1 * N3^2 * \bar{Z}wd * \bar{U}cs * \bar{Z}bs + 2 * \bar{Z}1 * N3^2 * \bar{Z}wd * \bar{U}bs * \\
& \bar{Z}ws + 2 * \bar{Z}1 * N3^2 * \bar{Z}wd * \bar{U}cs * \bar{Z}2 + 3 * N1^2 * \bar{U}as * \\
& \bar{Z}2 * Rd * \bar{Z}3 + 6 * N1^2 * \bar{U}as * \bar{Z}2 * \bar{Z}3 * \bar{Z}wd + 3 * N1^2 * \\
& \bar{U}as * \bar{Z}2 * \bar{Z}3 * \bar{Z}bd + 2 * N1^2 * \bar{U}as * \bar{Z}2 * Rd * \\
& \bar{Z}wd + N1^2 * \bar{U}as * \bar{Z}2 * Rd * \bar{Z}bd + 3 * N1^2 * \bar{U}as * \\
& \bar{Z}ws * Rd * \bar{Z}3 + 6 * N1^2 * \bar{U}as * \bar{Z}ws * \bar{Z}3 * \\
& \bar{Z}wd + 3 * N1^2 * \bar{U}as * \bar{Z}ws * \bar{Z}3 * \bar{Z}bd + 2 * N1^2 * \bar{U}as * \\
& \bar{Z}ws * Rd * \bar{Z}wd + N1^2 * \bar{U}as * \bar{Z}ws * Rd * \bar{Z}bd + 3 * N1^2 * \\
& \bar{U}as * \bar{Z}bs * Rd * \bar{Z}3 + 6 * N1^2 * \bar{U}as * \bar{Z}bs * \bar{Z}3 * \\
& \bar{Z}wd + 3 * N1^2 * \bar{U}as * \bar{Z}bs * \bar{Z}3 * \bar{Z}bd + 2 * N1^2 * \bar{U}as * \\
& \bar{Z}bs * Rd * \bar{Z}wd + N1^2 * \bar{U}as * \bar{Z}bs * Rd * \bar{Z}bd + 3 * \\
& \bar{Z}1 * N2^2 * \bar{U}as * Rd * \bar{Z}3 + 6 * \bar{Z}1 * N2^2 * \bar{U}as * \bar{Z}3 * \\
& \bar{Z}wd + 3 * \bar{Z}1 * N2^2 * \bar{U}as * \bar{Z}3 * \bar{Z}bd + 2 * \bar{Z}1 * N2^2 * \\
& \bar{U}as * Rd * \bar{Z}wd + \bar{Z}1 * N2^2 * \bar{U}as * Rd * \\
& \bar{Z}bd)/N1/(3 * Rd * \bar{Z}3 + 6 * \bar{Z}3 * \bar{Z}bd + 2 * Rd * \\
& \bar{Z}wd + Rd * \bar{Z}bd) \quad \text{(Eq. 25)}
\end{aligned}$$

$$\begin{aligned}
\bar{U}bp = & 1/N2/\bar{Z}bs * (3 * N1^2 * \bar{Z}wn * \bar{U}as * Rd * \bar{Z}3 + 6 * N1^2 * \\
& \bar{Z}wn * \bar{U}as * \bar{Z}3 * \bar{Z}wd + 3 * N1^2 * \bar{Z}wn * \bar{U}as * \bar{Z}3 * \\
& \bar{Z}bd + 2 * N1^2 * \bar{Z}wn * \bar{U}as * Rd * \bar{Z}wd + N1^2 * \bar{Z}wn * \\
& \bar{U}as * Rd * \bar{Z}bd + 3 * N1^2 * \bar{Z}wn * \bar{U}bs * Rd * \\
& \bar{Z}3 + 6 * N1^2 * \bar{Z}wn * \bar{U}bs * \bar{Z}3 * \bar{Z}wd + 3 * N1^2 * \bar{Z}wn * \\
& \bar{U}bs * \bar{Z}3 * \bar{Z}bd + 2 * N1^2 * \bar{Z}wn * \bar{U}bs * Rd * \bar{Z}wd + N1^2 * \\
& \bar{Z}wn * \bar{U}bs * Rd * \bar{Z}bd + 3 * N1^2 * \bar{Z}wn * \bar{U}cs * Rd * \\
& \bar{Z}3 + 6 * N1^2 * \bar{Z}wn * \bar{U}cs * \bar{Z}3 * \bar{Z}wd + 3 * N1^2 * \bar{Z}wn * \\
& \bar{U}cs * \bar{Z}3 * \bar{Z}bd + 2 * N1^2 * \bar{Z}wn * \bar{U}cs * Rd * \bar{Z}wd + N1^2 * \\
& \bar{Z}wn * \bar{U}cs * Rd * \bar{Z}bd + 2 * \bar{Z}1 * N3^2 * \bar{Z}wd * \bar{U}bs * \\
& \bar{Z}bs + 3 * \bar{Z}1 * N3^2 * \bar{Z}bd * \bar{Z}wn * \bar{U}bs + \bar{Z}1 * N3^2 * \bar{Z}bd * \\
& \bar{U}as * \bar{Z}ws + 3 * \bar{Z}1 * N3^2 * \bar{Z}bd * \bar{Z}wn * \bar{U}as + \bar{Z}1 * N3^2 * \\
& \bar{Z}bd * \bar{U}as * \bar{Z}2 + \bar{Z}1 * N3^2 * \bar{Z}bd * \bar{U}as * \bar{Z}bs + \\
& \bar{Z}1 * N3^2 * Rd * \bar{U}as * \bar{Z}bs + 6 * \bar{Z}1 * N3^2 * \bar{Z}wd * \bar{Z}wn * \\
& \bar{U}cs + 3 * \bar{Z}1 * N3^2 * \bar{Z}bd * \bar{Z}wn * \bar{U}cs + \bar{Z}1 * N3^2 * \bar{Z}bd * \\
& \bar{U}bs * \bar{Z}2 + \bar{Z}1 * N3^2 * \bar{Z}bd * \bar{U}cs * \bar{Z}2 + \bar{Z}1 * N3^2 * \bar{Z}bd * \\
& \bar{Z}cs * \bar{Z}ws + \bar{Z}1 * N3^2 * \bar{Z}bd * \bar{U}cs * \bar{Z}bs + \bar{Z}1 * N3^2 * \\
& \bar{Z}bd * \bar{U}bs * \bar{Z}ws + \bar{Z}1 * N3^2 * \bar{Z}bd * \bar{U}bs * \bar{Z}bs + \\
& \bar{Z}1 * N3^2 * Rd * \bar{U}as * \bar{Z}2 + \bar{Z}1 * N3^2 * Rd * \bar{U}as * \bar{Z}ws + 3 * \\
& \bar{Z}1 * N3^2 * Rd * \bar{Z}wn * \bar{U}as + 3 * \bar{Z}1 * N3^2 * Rd * \bar{Z}wn * \\
& \bar{U}bs + 3 * \bar{Z}1 * N3^2 * Rd * \bar{Z}wn * \bar{U}cs + \bar{Z}1 * N3^2 * Rd * \\
& \bar{U}bs * \bar{Z}2 + \bar{Z}1 * N3^2 * Rd * \bar{U}cs * \bar{Z}2 + \bar{Z}1 * N3^2 * Rd * \\
& \bar{U}cs * \bar{Z}ws + \bar{Z}1 * N3^2 * Rd * \bar{U}cs * \bar{Z}bs + \bar{Z}1 * N3^2 * Rd * \\
& \bar{U}bs * \bar{Z}ws + \bar{Z}1 * N3^2 * Rd * \bar{U}bs * \bar{Z}bs + 2 * \bar{Z}1 * N3^2 * \\
& \bar{Z}wd * \bar{U}as * \bar{Z}2 + 2 * \bar{Z}1 * N3^2 * \bar{Z}wd * \bar{U}as * \bar{Z}ws + 2 * \\
& \bar{Z}1 * N3^2 * \bar{Z}wd * \bar{U}as * \bar{Z}bs + 6 * \bar{Z}1 * N3^2 * \bar{Z}wd * \bar{Z}wn * \\
& \bar{U}as + 6 * \bar{Z}1 * N3^2 * \bar{Z}wd * \bar{Z}wn * \bar{U}bs + 2 * \bar{Z}1 * N3^2 * \\
& \bar{Z}wd * \bar{U}bs * \bar{Z}2 + 2 * \bar{Z}1 * N3^2 * \bar{Z}wd * \bar{U}cs * \bar{Z}ws + 2 * \\
& \bar{Z}1 * N3^2 * \bar{Z}wd * \bar{U}cs * \bar{Z}bs + 2 * \bar{Z}1 * N3^2 * \bar{Z}wd * \bar{U}bs * \\
& \bar{Z}ws + 2 * \bar{Z}1 * N3^2 * \bar{Z}wd * \bar{U}cs * \bar{Z}2 + 3 * N1^2 * \bar{U}bs * \\
& \bar{Z}2 * Rd * \bar{Z}3 + 6 * N1^2 * \bar{U}bs * \bar{Z}2 * \bar{Z}3 * \bar{Z}wd + 3 * N1^2 * \\
& \bar{U}bs * \bar{Z}2 * \bar{Z}3 * \bar{Z}bd + 2 * N1^2 * \bar{U}bs * \bar{Z}2 * Rd * \\
& \bar{Z}wd + N1^2 * \bar{U}bs * \bar{Z}2 * Rd * \bar{Z}bd + 3 * N1^2 * \bar{U}bs * \\
& \bar{Z}ws * Rd * \bar{Z}3 + 6 * N1^2 * \bar{U}bs * \bar{Z}ws * \bar{Z}3 * \\
& \bar{Z}wd + 3 * N1^2 * \bar{U}bs * \bar{Z}ws * \bar{Z}3 * \bar{Z}bd + 2 * N1^2 * \bar{U}bs * \\
& \bar{Z}ws * Rd * \bar{Z}wd + N1^2 * \bar{U}bs * \bar{Z}ws * Rd * \bar{Z}bd + 3 * N1^2 * \\
& \bar{U}bs * Rd * \bar{Z}3 + 6 * N1^2 * \bar{U}bs * \bar{Z}bs * \bar{Z}3 * \\
& \bar{Z}wd + 3 * N1^2 * \bar{U}bs * \bar{Z}bs * \bar{Z}3 * \bar{Z}bd + 2 * N1^2 * \bar{U}bs * \\
& \bar{Z}bs * Rd * \bar{Z}wd + N1^2 * \bar{U}bs * \bar{Z}bs * Rd * \bar{Z}bd + 3 * \\
& \bar{Z}1 * N2^2 * \bar{U}bs * Rd * \bar{Z}3 + 6 * \bar{Z}1 * N2^2 * \bar{U}bs * \bar{Z}3 * \\
& \bar{Z}wd + 3 * \bar{Z}1 * N2^2 * \bar{U}bs * \bar{Z}3 * \bar{Z}bd + 2 * \bar{Z}1 * N2^2 * \\
& \bar{U}bs * Rd * \bar{Z}wd + \bar{Z}1 * N2^2 * \bar{U}bs * Rd * \\
& \bar{Z}bd)/N1/(3 * Rd * \bar{Z}3 + 6 * \bar{Z}3 * \bar{Z}wd + 3 * \bar{Z}3 * \\
& \bar{Z}bd + 2 * Rd * \bar{Z}wd + Rd * \bar{Z}bd) \quad \text{(Eq. 26)}
\end{aligned}$$

$$\begin{aligned}
\bar{U}cp = & 1/N2/\bar{Z}bs * (3 * N1^2 * \bar{Z}wn * \bar{U}as * Rd * \bar{Z}3 + 6 * N1^2 * \\
& \bar{Z}wn * \bar{U}as * \bar{Z}3 * \bar{Z}wd + 3 * N1^2 * \bar{Z}wn * \bar{U}as * \bar{Z}3 * \\
& \bar{Z}bd + 2 * N1^2 * \bar{Z}wn * \bar{U}as * Rd * \bar{Z}wd + N1^2 * \bar{Z}wn * \\
& \bar{U}as * Rd * \bar{Z}bd + 3 * N1^2 * \bar{U}cs * Z2 * Rd * \bar{Z}3 + 6 * N1^2 * \\
& \bar{U}cs * \bar{Z}2 * \bar{Z}3 * \bar{Z}wd + 3 * N1^2 * \bar{U}cs * \bar{Z}2 * \bar{Z}3 * \\
& \bar{Z}bd + 2 * N1^2 * \bar{U}cs * \bar{Z}2 * Rd * \bar{Z}wd + N1^2 * \bar{U}cs *
\end{aligned}$$

$$\begin{aligned}
&\overline{Z}2*Rd*\overline{Z}bd+3*N1^{2}*\overline{U}cs*\overline{Z}ws*Rd*\overline{Z}3+6*N1^{2}*\\
&\overline{U}cs*\overline{Z}ws*\overline{Z}3*\overline{Z}wd+3*N1^{2}*\overline{U}cs*e,\text{ovs } \overline{Z}ws*\overline{Z}3*\\
&\overline{Z}bd+2*N1^{2}*\overline{U}cs*\overline{Z}ws*Rd*\overline{Z}wd+N1^{2}*\overline{U}cs*\\
&\overline{Z}ws*Rd*\overline{Z}bd+3*N1^{2}*\overline{U}cs*\overline{Z}bs*Rd*\overline{Z}3+6*N1^{2}*\\
&\overline{U}cs*\overline{Z}bs*\overline{Z}3*\overline{Z}wd+3*N1^{2}*\overline{U}cs*\overline{Z}bs*\overline{Z}3*\\
&\overline{Z}bd+2*N1^{2}*\overline{U}cs*\overline{Z}bs*Rd*\overline{Z}wd+N1^{2}*\overline{U}cs*\\
&\overline{Z}bs*Rd*\overline{Z}bd+3*\overline{Z}1*N2^{2}*\overline{U}cs*Rd*\overline{Z}3+6*\\
&\overline{Z}1*N2^{2}*\overline{U}cs*\overline{Z}3*\overline{Z}wd+3*\overline{Z}1*N2^{2}*\overline{U}cs*\overline{Z}3*\\
&\overline{Z}bd+2*\overline{Z}1*N2^{2}*\overline{U}cs*Rd*\overline{Z}wd+\overline{Z}1*N2^{2}*\\
&\overline{U}cs*Rd*\overline{Z}bd+3*N1^{2}*\overline{Z}wn*\overline{U}bs*Rd*\\
&\overline{Z}3+6*N1^{2}*\overline{Z}wn*\overline{U}bs*\overline{Z}3*\overline{Z}wd+3*N1^{2}*\overline{Z}wn*\\
&\overline{U}bs*\overline{Z}3*\overline{Z}bd+2*N1^{2}*\overline{Z}wn*\overline{U}bs*Rd*\overline{Z}wd+N1^{2}*\\
&\overline{Z}wn*\overline{U}bs*Rd*\overline{Z}bd+3*N1^{2}*\overline{Z}wn*\overline{U}cs*Rd*\\
&\overline{Z}3+6*N1^{2}*\overline{Z}wn*\overline{U}cs*\overline{Z}3*\overline{Z}wd+3*N1^{2}*\overline{Z}wn*\\
&\overline{U}cs*\overline{Z}3*\overline{Z}bd+2*N1^{2}*\overline{Z}wn*\overline{U}cs*Rd*\overline{Z}wd+N1^{2}*\\
&\overline{Z}wn*\overline{U}cs*Rd*\overline{Z}bd+2*\overline{Z}1*N3^{2}*\overline{Z}wd*\overline{U}bs*\\
&\overline{Z}bs+3*\overline{Z}1*N3^{2}*\overline{Z}bd*\overline{Z}wn*\overline{U}bs+\overline{Z}1*N3^{2}*\overline{Z}bd*\\
&\overline{U}as*\overline{Z}ws+3*\overline{Z}1*N3^{2}*\overline{Z}bd*\overline{U}as+\overline{Z}1*N3^{2}*\\
&\overline{Z}bd*\overline{U}as*\overline{Z}2+\overline{Z}1*N3^{2}*\overline{Z}bd*\overline{U}as*\overline{Z}bs+\\
&\overline{Z}1*N3^{2}*Rd*\overline{U}as*\overline{Z}bs+6*\overline{Z}1*N3^{2}*\overline{Z}wd*\overline{Z}wn*\\
&\overline{U}cs+3*\overline{Z}1*N3^{2}*\overline{Z}bd*\overline{Z}wn*\overline{U}cs+\overline{Z}1*N3^{2}*\overline{Z}bd*\\
&\overline{U}bs*\overline{Z}2+\overline{Z}1*N3^{2}*\overline{Z}bd*\overline{U}bs*\overline{Z}ws+\overline{Z}1*N3^{2}*\overline{Z}bd*\\
&\overline{U}cs*\overline{Z}ws+\overline{Z}1*N3^{2}*\overline{Z}bd*\overline{U}cs*\overline{Z}bs+\overline{Z}1*N3^{2}*\\
&\overline{Z}bd*\overline{U}bs*\overline{Z}ws+\overline{Z}1*N3^{2}*\overline{Z}bd*\overline{U}bs*\overline{Z}bs+\\
&\overline{Z}1*N3^{2}*Rd*\overline{U}as*\overline{Z}2+\overline{Z}1*N3^{2}*Rd*\overline{U}as*\overline{Z}ws+3*\\
&\overline{Z}1*N3^{2}*Rd*\overline{Z}wn*\overline{U}as+\overline{Z}1*N3^{2}*Rd*\overline{Z}wn*\\
&\overline{U}bs+3*\overline{Z}1*N3^{2}*Rd*\overline{Z}wn*\overline{U}cs+\overline{Z}1*N3^{2}*Rd*\\
&\overline{U}bs*\overline{Z}2+\overline{Z}1*N3^{2}*Rd*\overline{U}cs*\overline{Z}2+\overline{Z}1*N3^{2}*Rd*\\
&\overline{U}cs*\overline{Z}ws+\overline{Z}1*N3^{2}*Rd*\overline{U}cs*\overline{Z}bs+\overline{Z}1*N3^{2}*Rd*\\
&\overline{U}bs*\overline{Z}ws+\overline{Z}1*N3^{2}*Rd*\overline{U}bs*\overline{Z}bs+2*\overline{Z}1*N3^{2}*\\
&\overline{Z}wd*\overline{U}as*\overline{Z}2+2*\overline{Z}1*N3^{2}*\overline{Z}wd*\overline{U}as*\overline{Z}ws+2*\\
&\overline{Z}1*N3^{2}*\overline{Z}wd*\overline{U}\overline{Z}bs+6*\overline{Z}1*N3^{2}*\overline{Z}wd*\overline{Z}wn*\\
&\overline{U}as+6*\overline{Z}1*N3^{2}*\overline{Z}wd*\overline{Z}wn*\overline{U}bs+2*\overline{Z}1*N3^{2}*\\
&\overline{Z}wd*\overline{U}bs*\overline{Z}2+2*\overline{Z}1*N3^{2}*\overline{Z}wd*\overline{U}cs*\overline{Z}ws+2*\\
&\overline{Z}1*N3^{2}*\overline{Z}wd*\overline{U}cs*\overline{Z}bs+2*\overline{Z}1*N3^{2}*\overline{Z}wd*\overline{U}bs*\\
&\overline{Z}ws+2*\overline{Z}1*N3^{2}*\overline{Z}wd*\overline{U}cs*\overline{Z}2)/N1/(3*Rd*\\
&\overline{Z}3+6*\overline{Z}3*\overline{Z}wd+3*\overline{Z}3*\overline{Z}bd+2*Rd*\overline{Z}wd+Rd*\\
&\overline{Z}bd) \quad\quad (\text{Eq. 27})
\end{aligned}$$

In case the secondary burden is delta connected, the equivalent scheme of FIG. 5 can be utilized. The neutral conductor impedance $\overline{Z}wn$ then equals infinity. $\overline{Z}bs$ values can be obtained using delta-star conversion for impedances. Equations 28-30 apply:

$$\begin{aligned}
\overline{U}ap = &1/3*(-3*N1^{2}*\overline{Z}3*Rd*\overline{Z}ws*\overline{U}cs+6*N1^{2}*\\
&\overline{Z}3*Rd*\overline{Z}2*\overline{U}as-3*N1^{2}*\overline{Z}3*Rd*\overline{Z}2*\\
&\overline{U}bs-3*N1^{2}*\overline{Z}3*\overline{Z}bd*\overline{Z}2*\overline{U}bs-3*N1^{2}*\overline{Z}3*\overline{Z}bd*\\
&\overline{Z}ws*\overline{U}cs-6*N1^{2}*\overline{Z}3*\overline{Z}wd*\overline{Z}2*\overline{U}cs+12*N1^{2}*\\
&\overline{Z}3*\overline{Z}wd*\overline{Z}ws*\overline{U}as-6*N1^{2}*\overline{Z}3*\overline{Z}wd*\overline{Z}ws*\\
&\overline{U}bs+6*N1^{2}*\overline{Z}3*\overline{Z}bd*\overline{Z}2*\overline{U}as+3*\overline{Z}bs*\overline{Z}1*N3^{2}*\\
&\overline{Z}bd*\overline{U}as+6*N1^{2}*\overline{Z}3*Rd*\overline{Z}ws*\overline{U}as-3*N1^{2}*\\
&\overline{Z}3*Rd*\overline{Z}ws*\overline{U}bs-N1^{2}*\overline{Z}2*\overline{U}cs*Rd*\\
&\overline{Z}bd-2*N1^{2}*\overline{Z}2*\overline{U}cs*Rd*\overline{Z}wd+3*\overline{Z}bs*e,\text{ovs}\\
&\overline{Z}1*N3^{2}*\overline{Z}bd*\overline{U}bs+6*\overline{Z}bs*\overline{Z}1*N3^{2}*\overline{Z}wd*\\
&\overline{U}cs+6*\overline{Z}bs*\overline{Z}1*N3^{2}*\overline{Z}wd*\overline{U}as-3*N1^{2}*\overline{Z}3*Rd*\\
&\overline{Z}2*\overline{U}cs+6*\overline{Z}bs*\overline{Z}1*N3^{2}*\overline{Z}wd*\overline{U}bs+3*\overline{Z}bs*\\
&\overline{Z}1*N3^{2}*Rd*\overline{U}cs+3*\overline{Z}1*N3^{2}*\overline{Z}bd*\overline{U}cs+3*\\
&\overline{Z}bs*\overline{Z}1*N3^{2}*Rd*\overline{U}bs+3*\overline{Z}bs*\overline{Z}1*N3^{2}*Rd*\\
&\overline{U}as+18*\overline{Z}bs*N1^{2}*\overline{Z}3*\overline{Z}wd*\overline{U}as+3*\overline{Z}bs*N1^{2}*\\
&\overline{U}as*Rd*\overline{Z}bd-6*N1^{2}*\overline{Z}3*\overline{Z}wd*\overline{Z}ws*\overline{U}cs+6*\\
&\overline{Z}bs*N1^{2}*\overline{U}as*Rd*\overline{Z}wd+9*\overline{Z}bs*N1^{2}*\overline{Z}3*Rd*\\
&\overline{U}as+9*\overline{Z}bs*N1^{2}*\overline{Z}3*\overline{Z}bd*\overline{U}as-3*\overline{Z}1*N2^{2}*\\
&\overline{U}cs*Rd*\overline{Z}3+12*\overline{Z}1*N2^{2}*\overline{U}as*\overline{Z}wd*\overline{Z}3-3*\\
&\overline{Z}1*N2^{2}*\overline{U}cs*\overline{Z}bd*\overline{Z}3-6*\overline{Z}1*N2^{2}*\overline{U}cs*\overline{Z}wd*\\
&\overline{Z}3+2*\overline{Z}1*N2^{2}*\overline{U}as*Rd*\overline{Z}bd+4*\overline{Z}1*N2^{2}*\\
&\overline{U}as*Rd*\overline{Z}wd+6*\overline{Z}1*N2^{2}*\overline{U}as*\overline{Z}bd*\overline{Z}3-\\
&\overline{Z}1*N2^{2}*\overline{U}cs*Rd*\overline{Z}bd-2*\overline{Z}1*N2^{2}*\overline{U}cs*Rd*\\
&\overline{Z}wd-3*\overline{Z}1*N2^{2}*\overline{U}bs*Rd*\overline{Z}3-N1^{2}*\overline{Z}ws*\\
&\overline{U}bs*Rd*\overline{Z}bd-6*N1^{2}*\overline{Z}3*\overline{Z}wd*\overline{Z}2*\\
&\overline{U}bs-2*N1^{2}*\overline{Z}ws*\overline{U}bs*Rd*\overline{Z}wd+6*\overline{Z}1*N2^{2}*\\
&\overline{U}as*Rd*\overline{Z}3+12*N1^{2}*\overline{Z}3*\overline{Z}wd*\overline{Z}2*\overline{U}as-6*\\
&\overline{Z}1*N2^{2}*\overline{U}bs*\overline{Z}wd*\overline{Z}3-2*\overline{Z}1*N2^{2}*\overline{U}bs*Rd*\\
&\overline{Z}wd-3*\overline{Z}1*N2^{2}*\overline{U}bs*\overline{Z}bd*\overline{Z}3-2*N1^{2}*\overline{Z}ws*\\
&\overline{U}cs*Rd*\overline{Z}wd+2*N1^{2}*\overline{Z}2*\overline{U}as*Rd*\overline{Z}bd+4*N1^{2}*\\
&\overline{Z}2*\overline{U}as*Rd*\overline{Z}wd-\overline{Z}1*N2^{2}*\overline{U}bs*Rd*\overline{Z}bd-N1^{2}*\\
&\overline{Z}ws*\overline{U}cs*Rd*\overline{Z}bd-3*N1^{2}*\overline{Z}3*\overline{Z}bd*\overline{Z}ws*\\
&\overline{U}bs-N1^{2}*\overline{Z}2*\overline{U}bs*Rd*\overline{Z}bd-2*N1^{2}*\overline{Z}2*\\
&\overline{U}bs*Rd*\overline{Z}wd+2*N1^{2}*\overline{Z}ws*\overline{U}as*Rd*\\
&\overline{Z}bd+4*N1^{2}*\overline{Z}ws*\overline{U}as*Rd*\overline{Z}wd-3*N1^{2}*\overline{Z}3*\\
&\overline{Z}bd*\overline{Z}2*\overline{U}cs+6*N1^{2}*\overline{Z}3*\overline{Z}bd*\overline{Z}ws*\overline{U}as)/N1/\\
&\overline{Z}bs/N2/(6*\overline{Z}wd*\overline{Z}3+3*\overline{Z}bd*\overline{Z}3+2*Rd*\\
&\overline{Z}wd+Rd*\overline{Z}bd+3*Rd*\overline{Z}3) \quad\quad (\text{Eq. 28})
\end{aligned}$$

$$\begin{aligned}
\overline{U}bp = &-1/3*(3*N1^{2}*\overline{Z}3*Rd*\overline{Z}ws*\overline{U}cs+3*N1^{2}*\\
&\overline{Z}3*Rd*\overline{Z}2*\overline{U}as-6*N1^{2}*\overline{Z}3*Rd*\overline{Z}2*\\
&\overline{U}bs-6*N1^{2}*\overline{Z}3*\overline{Z}bd*\overline{Z}2*\overline{U}bs+3*N1^{2}*\overline{Z}3*\overline{Z}bd*\\
&\overline{Z}ws*\overline{U}cs+6*N1^{2}*\overline{Z}3*\overline{Z}wd*\overline{Z}2*\overline{U}cs+6*N1^{2}*\overline{Z}3*\\
&\overline{Z}wd*\overline{Z}ws*\overline{U}as-12*N1^{2}*\overline{Z}3*\overline{Z}wd*\overline{Z}ws*\\
&\overline{U}bs+3*N1^{2}*\overline{Z}3*\overline{Z}bd*\overline{Z}2*\overline{U}as-3*\overline{Z}bs*\overline{Z}1*N3^{2}*\\
&\overline{Z}bd*\overline{U}as+3*N1^{2}*\overline{Z}3*Rd*\overline{Z}ws*\overline{U}as-6*N1^{2}*\\
&\overline{Z}3*Rd*\overline{Z}ws*\overline{U}bs+N1^{2}*\overline{Z}2*\overline{U}cs*Rd*\\
&\overline{Z}bd+2*N1^{2}*\overline{Z}2*\overline{U}cs*Rd*\overline{Z}wd-3*\overline{Z}bs*\overline{Z}1*N3^{2}*\\
&\overline{Z}bd*\overline{U}bs-6*\overline{Z}bs*\overline{Z}1*N3^{2}*\overline{Z}wd*\overline{U}cs-6*\overline{Z}bs*\\
&\overline{Z}1*N3^{2}*\overline{Z}wd*\overline{U}as+3*N1^{2}*\overline{Z}3*Rd*\overline{Z}2*\overline{U}cs-6*\\
&\overline{Z}bs*\overline{Z}1*N3^{2}*\overline{Z}wd*\overline{U}bs-3*\overline{Z}bs*\overline{Z}1*N3^{2}*Rd*\\
&\overline{U}cs-3*\overline{Z}bs*\overline{Z}1*N3^{2}*\overline{Z}bd*\overline{U}cs-3*\overline{Z}bs*\\
&\overline{Z}1*N3^{2}*Rd*\overline{U}bs-3*\overline{Z}bs*\overline{Z}1*N3^{2}*Rd*\\
&\overline{U}as+6*N1^{2}*\overline{Z}3*\overline{Z}wd*\overline{Z}ws*\overline{U}cs+3*\overline{Z}1*N2^{2}*\\
&\overline{U}cs*Rd*\overline{Z}3+6*\overline{Z}1*N2^{2}*\overline{U}as*\overline{Z}wd*\overline{Z}3+3*\\
&\overline{Z}1*N2^{2}*\overline{U}cs*\overline{Z}bd*\overline{Z}3+6*\overline{Z}1*N2^{2}*\overline{U}cs*\overline{Z}wd*\\
&\overline{Z}3+\overline{Z}1*N2^{2}*\overline{U}as*Rd*\overline{Z}bd+2*\overline{Z}1*N2^{2}*\overline{U}as*Rd*\\
&\overline{Z}wd+3*\overline{Z}1*N2^{2}*\overline{U}as*\overline{Z}bd*\overline{Z}3+\overline{Z}1*N2^{2}*\\
&\overline{U}cs*Rd*\overline{Z}bd+2*\overline{Z}1*N2^{2}*\overline{U}cs*Rd*\overline{Z}wd-6*\\
&\overline{Z}1*N2^{2}*\overline{U}bs*Rd*\overline{Z}3-2*N1^{2}*\overline{Z}ws*\overline{U}bs*Rd*\\
&\overline{Z}bd-12*N1^{2}*\overline{Z}3*\overline{Z}wd*\overline{Z}2*\overline{U}bs-4*N1^{2}*\overline{Z}ws*\\
&\overline{U}bs*Rd*\overline{Z}wd+3*\overline{Z}1*N2^{2}*\overline{U}as*Rd*\overline{Z}3+6*N1^{2}*\\
&\overline{Z}3*\overline{Z}wd*\overline{Z}2*\overline{U}as-12*N2^{2}*\overline{U}bs*\overline{Z}wd*\overline{Z}3-4*\\
&\overline{Z}1*N2^{2}*\overline{U}bs*Rd*\overline{Z}wd-6*\overline{Z}1*N2^{2}*\overline{U}bs*\overline{Z}bd*\\
&\overline{Z}3+2*N1^{2}*\overline{Z}ws*\overline{U}cs*Rd*\overline{Z}wd+N1^{2}*\overline{Z}2*\\
&\overline{U}as*Rd*\overline{Z}bd+2*N1^{2}*\overline{Z}2*\overline{U}as*Rd*\overline{Z}wd-2*\\
&\overline{Z}1*N2^{2}*\overline{U}bs*Rd*\overline{Z}bd-9*N1^{2}*\overline{Z}bs*\overline{Z}3*Rd*\\
&\overline{U}bs-9*N1^{2}*\overline{Z}bs*\overline{Z}3*\overline{Z}bd*\overline{U}bs-6*N1^{2}*\overline{U}bs*\\
&\overline{Z}bs*Rd*\overline{Z}wd-3*N1^{2}*\overline{U}bs*\overline{Z}bs*Rd*\\
&\overline{Z}bd-18*N1^{2}*\overline{Z}bs*\overline{Z}3*\overline{Z}wd*\overline{U}bs+N1^{2}*\overline{Z}ws*\\
&\overline{U}cs*Rd*\overline{Z}bd-6*N1^{2}*\overline{Z}3*\overline{Z}bd*\overline{Z}ws*\\
&\overline{U}bs-2*N1^{2}*\overline{Z}2*\overline{U}bs*Rd*\overline{Z}bd-4*N1^{2}*\overline{Z}2*\\
&\overline{U}bs*Rd*\overline{Z}wd+N1^{2}*\overline{Z}ws*\overline{U}as*Rd*\overline{Z}bd+2*N1^{2}*\\
&\overline{Z}ws*\overline{U}as*Rd*\overline{Z}wd+3*N1^{2}*\overline{Z}3*\overline{Z}bd*\overline{Z}2*\\
&\overline{U}cs+3*N1^{2}*\overline{Z}3*\overline{Z}bd*\overline{Z}ws*\overline{U}as)/N1/\overline{Z}bs/N2/(6*\\
&\overline{Z}wd*\overline{Z}3+3*\overline{Z}bd*\overline{Z}3+2*Rd*\overline{Z}wd+Rd*\\
&\overline{Z}bd+3*Rd*\overline{Z}3) \quad\quad (\text{Eq. 29})
\end{aligned}$$

$$\begin{aligned}
\overline{U}cp = &-1/3*(-6*N1^{2}*\overline{Z}3*Rd*\overline{Z}ws*\overline{U}cs+3*N1^{2}*\\
&\overline{Z}3*Rd*\overline{Z}2*\overline{U}as+3*N1^{2}*\overline{Z}3*Rd*\overline{Z}2*\\
&\overline{U}bs+3*N1^{2}*\overline{Z}3*\overline{Z}bd*\overline{Z}2*\overline{U}bs-6*N1^{2}*\overline{Z}3*\overline{Z}bd*\\
&\overline{Z}ws*\overline{U}cs-12*N1^{2}*\overline{Z}3*\overline{Z}wd*\overline{Z}2*\overline{U}cs+6*N1^{2}*\\
&\overline{Z}3*\overline{Z}wd*\overline{Z}ws*\overline{U}as+6*N1^{2}*\overline{Z}3*\overline{Z}wd*\overline{Z}ws*\\
&\overline{U}bs+3*N1^{2}*\overline{Z}3*\overline{Z}bd*\overline{Z}2*\overline{U}as-3*\overline{Z}bs*\overline{Z}1*N3^{2}*\\
&\overline{Z}bd*\overline{U}as+3*N1^{2}*\overline{Z}3*Rd*\overline{Z}ws*\overline{U}as+3*N1^{2}*\\
&\overline{Z}3*Rd*\overline{Z}ws*\overline{U}bs-2*N1^{2}*\overline{Z}2*\overline{U}cs*Rd*\\
&\overline{Z}bd-4*N1^{2}*\overline{Z}2*\overline{U}cs*Rd*\overline{Z}wd-3*\overline{Z}bs*\overline{Z}1*N3^{2}*\\
&\overline{Z}bd*\overline{U}bs-6*\overline{Z}bs*\overline{Z}1*N3^{2}*\overline{Z}wd*\overline{U}cs-6*\overline{Z}bs*\\
&\overline{Z}1*N3^{2}*\overline{Z}wd*\overline{U}as-6*N1^{2}*\overline{Z}3*Rd*\overline{Z}2*\overline{U}cs-6*\\
&\overline{Z}bs*\overline{Z}1*N3^{2}*\overline{Z}wd*\overline{U}bs-3*\overline{Z}bs*\overline{Z}1*N3^{2}*Rd*\\
&\overline{U}cs-3*\overline{Z}bs*\overline{Z}1*N3^{2}*\overline{Z}bd*\overline{U}cs-3*\overline{Z}bs*\\
&\overline{Z}1*N3^{2}*Rd*\overline{U}bs-3*\overline{Z}bs*\overline{Z}1*N3^{2}*Rd*\\
&\overline{U}as-12*N1^{2}*\overline{Z}3*\overline{Z}wd*\overline{Z}ws*\overline{U}cs-6*\overline{Z}1*N2^{2}*\\
&\overline{U}cs*Rd*\overline{Z}3+6*\overline{Z}1*N2^{2}*\overline{U}as*\overline{Z}wd*\overline{Z}3-6*\\
&\overline{Z}1*N2^{2}*\overline{U}cs*\overline{Z}bd*\overline{Z}3-12*\overline{Z}1*N2^{2}*\overline{U}cs*\overline{Z}wd*\\
&\overline{Z}3+\overline{Z}1*N2^{2}*\overline{U}as*Rd*\overline{Z}bd+2*\overline{Z}1*N2^{2}*\overline{U}as*Rd*\\
&\overline{Z}wd+3*\overline{Z}1*N2^{2}*\overline{U}as*\overline{Z}bd*\overline{Z}3-2*\overline{Z}1*N2^{2}*\\
&\overline{U}cs*Rd*\overline{Z}bd-4*\overline{Z}1*N2^{2}*\overline{U}cs*Rd*\overline{Z}wd+3*\\
&\overline{Z}1*N2^{2}*\overline{U}bs*Rd*\overline{Z}3+N1^{2}*\overline{Z}ws*\overline{U}bs*Rd*\\
&\overline{Z}bd+6*N1^{2}*\overline{Z}3*\overline{Z}wd*\overline{Z}2*\overline{U}bs+2*N1^{2}*\overline{Z}ws*\\
&\overline{U}bs*Rd*\overline{Z}wd+3*\overline{Z}1*N2^{2}*\overline{U}as*Rd*\overline{Z}3+6*N1^{2}*\\
&\overline{Z}3*\overline{Z}wd*\overline{Z}2*\overline{U}as+6*\overline{Z}1*N2^{2}*\overline{U}bs*\overline{Z}wd*\overline{Z}3+2*\\
&\overline{Z}1*N2^{2}*\overline{U}bs*Rd*\overline{Z}wd+3*\overline{Z}1*N2^{2}*\overline{U}bs*\overline{Z}bd*\\
&\overline{Z}3-4*N1^{2}*\overline{Z}ws*\overline{U}cs*Rd*\overline{Z}wd+N1^{2}*\overline{Z}2*\\
&\overline{U}as*Rd*\overline{Z}bd+2*N1^{2}*\overline{Z}2*\overline{U}as*Rd*\overline{Z}wd+\\
&\overline{Z}1*N2^{2}*\overline{U}bs*Rd*\overline{Z}bd-2*N1^{2}*\overline{Z}ws*\overline{U}cs*Rd*\\
&\overline{Z}bd+3*N1^{2}*\overline{Z}3*\overline{Z}bd*\overline{Z}ws*\overline{U}bs+N1^{2}*\overline{Z}2*\\
&\overline{U}bs*Rd*\overline{Z}bd+2*N1^{2}*\overline{Z}2*\overline{U}bs*Rd*\overline{Z}wd+N1^{2}*\\
&\overline{Z}ws*\overline{U}as*Rd*\overline{Z}bd+2*N1^{2}*\overline{Z}ws*\overline{U}as*Rd*\\
&\overline{Z}wd-6*N1^{2}*\overline{Z}3*\overline{Z}bd*\overline{Z}2*\overline{U}cs+3*N1^{2}*\overline{Z}3*\overline{Z}bd*\\
&\overline{Z}ws*\overline{U}as-18*N1^{2}*\overline{Z}bs*\overline{Z}3*\overline{Z}wd*\overline{U}cs-9*N1^{2}*\\
&\overline{Z}bs*\overline{Z}3*\overline{Z}bd*\overline{U}cs-6*N1^{2}*\overline{Z}bs*\overline{U}cs*Rd*\\
&\overline{Z}wd-3*N1^{2}*\overline{Z}bs*\overline{U}cs*Rd*\overline{Z}bd-9*N1^{1}*\overline{Z}bs*\\
&\overline{Z}3*Rd*\overline{U}cs)/N1/\overline{Z}bs/N2/(6*\overline{Z}wd*\overline{Z}3+3*\overline{Z}bd*\\
&\overline{Z}3+2*Rd*\overline{Z}wd+Rd*\overline{Z}bd+3*Rd*\overline{Z}3) \quad\quad (\text{Eq. 30})
\end{aligned}$$

As can be seen from the above equations for $\overline{U}ap$, $\overline{U}bp$ and $\overline{U}cp$, in order to calculate primary phase-to-earth voltages from measured secondary voltages $\overline{U}as$, $\overline{U}bs$ and $\overline{U}cs$, the latter voltages may be corrected by one or more parameters of the transformers including, for example:

$\overline{Z}1$=Impedance of the primary winding
$\overline{Z}2$=Impedance of the secondary winding
$\overline{Z}3$=Impedance of the tertiary winding
N1=Number of turns of wire in the primary winding
N2=Number of turns of wire in the secondary winding
N3=Number of turns of wire in the tertiary winding
and/or by one or more parameters of the external wiring and/or burden:
the circuit connected to the secondary windings comprising for example:
$\overline{Z}ws$=Wiring impedance of the secondary circuit
$\overline{Z}wn$=Wiring impedance of the secondary circuit, neutral conductor
$\overline{Z}bs$=Secondary burden impedance
the circuit connected to the tertiary windings comprising for example:
$\overline{Z}wd$=Wiring impedance of the open delta
$\overline{Z}bd$=Tertiary burden impedance
Rd=Ferroresonance (tertiary) damping resistance.

In addition, all the phases are coupled. That is, the phase voltage of phase PA, for example, is affected by phases PB and PC through open-delta winding.

According to an exemplary embodiment, the measured secondary voltages $\overline{U}as$, $\overline{U}bs$, $\overline{U}cs$ can be corrected, for example, by utilizing exemplary equations 25-27 or 28-30, to take into account the parameters of the transformers and/or external wiring and/or burdens. After correction, the secondary voltages can match the true primary voltages $\overline{U}ap$, $\overline{U}bp$ and $\overline{U}cp$.

In addition to the secondary voltages, the parameters of transformers and external wiring and burdens also affect the measurement accuracy of the open-delta voltage. The correct value of the residual voltage can be calculated utilizing equations 25 to 30 by calculating the sum of the corrected secondary voltages: residual voltage=(eq25+eq26+eq27)/3 or (eq28+eq29+eq30)/3.

Figure 6:
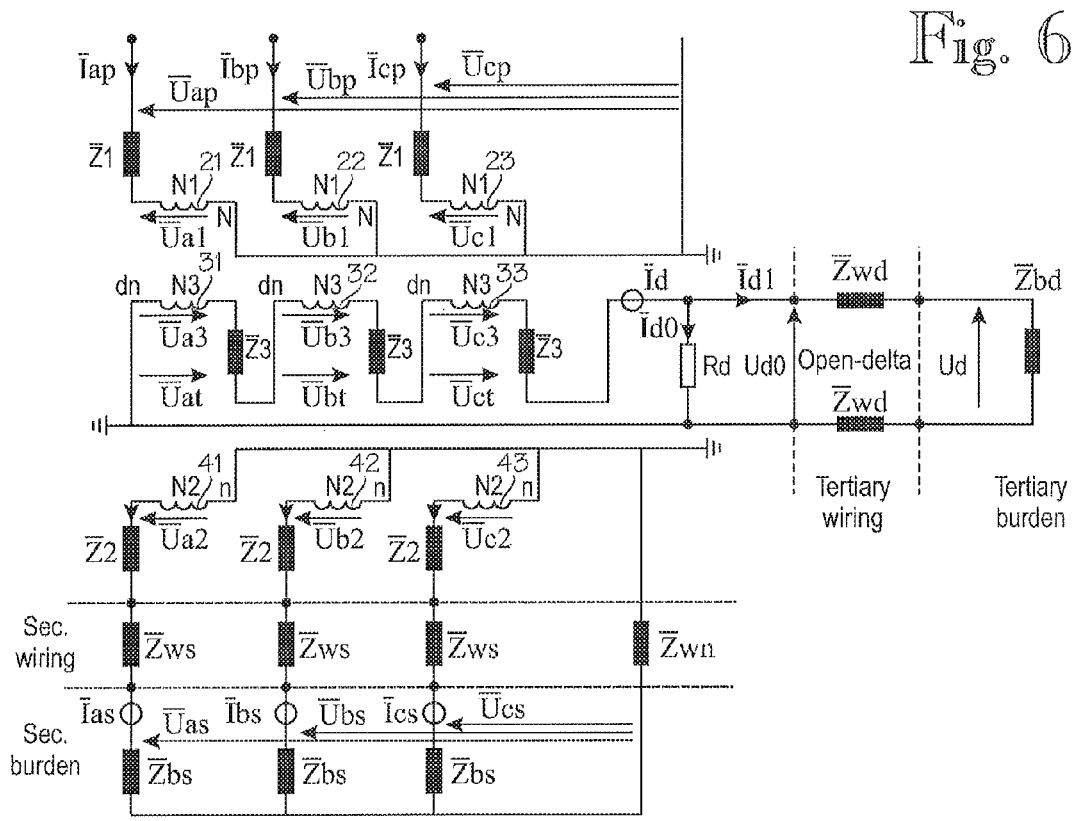
FIG. 6 shows an equivalent circuit of three single pole instrument voltage transformers where secondary burden is star-connected, according to an exemplary embodiment of the present disclosure.
Figure 7:
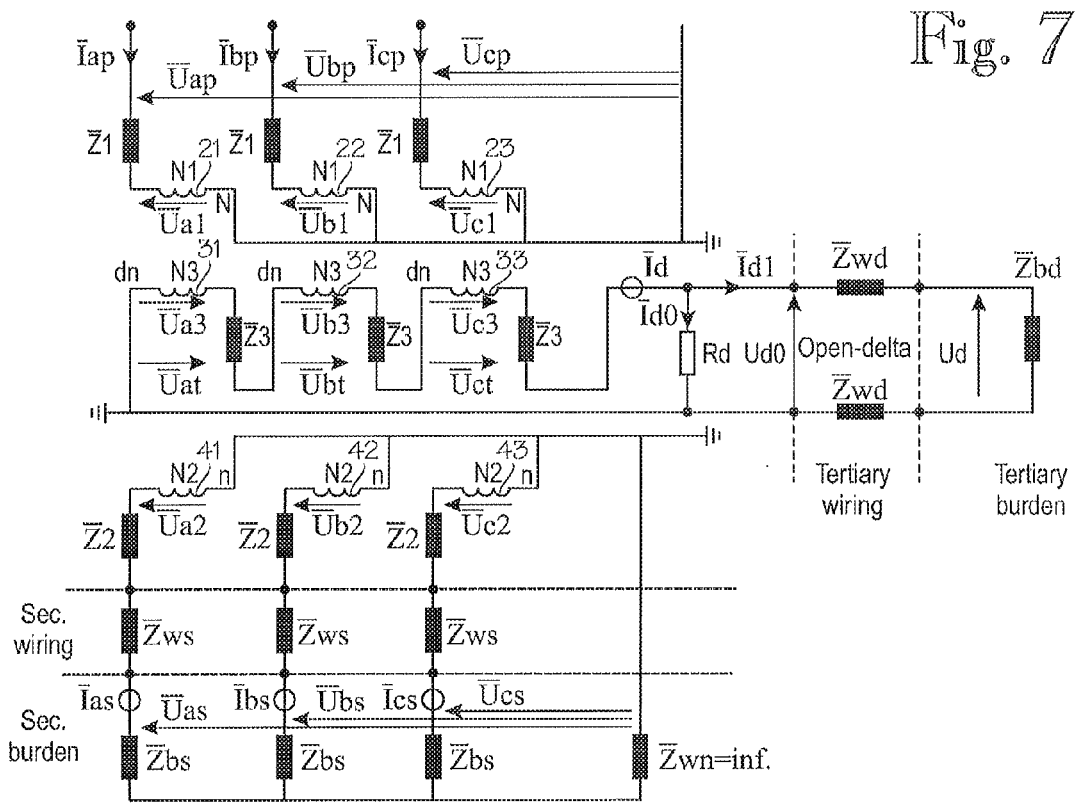
FIG. 7 shows an equivalent circuit of three single pole instrument voltage transformers where secondary burden is delta-connected (after delta-star conversion) according to an exemplary embodiment of the present disclosure.

It should be noted, however, that the correction applied to the measured secondary voltages may be based on any combination of one or more of the parameters described above. Thus, one or more parameters in equations 25-30 may be excluded or replaced with one or more other parameters. Also further parameters may be used. The basic idea of the present disclosure is not limited to any particular combination of parameters used or any particular equation. In addition, one or more quantities in a known relation to one or more of the parameters may be used when applying the correction to the measured secondary voltages. Such one or more quantities in a known relation to one or more of the parameters may then replace the one or more parameters in question in equations 25-30 or corresponding equations. Examples of quantities in a known relation to one or more of said parameters of the transformers and/or of the external wiring and/or burden include secondary currents measured from the secondary windings and a tertiary current measured from the tertiary windings. The use of these quantities is described in more detail in the following examples:

In case secondary and tertiary currents are measured as shown in the exemplary electrical equivalent schemes of FIGS. 6 and 7:
$\overline{I}as$=Phase PA secondary phase current
$\overline{I}bs$=Phase PB secondary phase current
$\overline{I}cs$=Phase PC secondary phase current
$\overline{I}d=\overline{I}d0+\overline{I}d1$=Total tertiary current
$\overline{I}d0$=Tertiary current through damping resistor
$\overline{I}d1$=Tertiary current through tertiary burden Then, the accurate primary phase-to-earth voltages can be obtained utilizing the following equations:

In case the secondary burden is star-connected and the common neutral conductor wiring impedance is $\overline{Z}wn$ as shown in FIG. 6. $\overline{Z}ws$=Wiring impedance of secondary circuit (in case the current measurement is not done at the terminals of the voltage transformer):

$$\overline{U}_{ap} = \frac{\overline{U}_{as}}{N21} + \frac{(\overline{Z}1 \cdot N21^2 + \overline{Z}2 + \overline{Z}ws) \cdot \overline{I}_{as} + (N21 \cdot N31 \cdot \overline{Z}1) \cdot \overline{I}_d + \overline{Z}wn \cdot (\overline{I}_{as} + \overline{I}_{bs} + \overline{I}_{cs})}{N21} \quad \text{(Eq. 31)}$$

$$\overline{U}_{bp} = \frac{\overline{U}_{bs}}{N21} + \frac{(\overline{Z}1 \cdot N21^2 + \overline{Z}2 + \overline{Z}ws) \cdot \overline{I}_{bs} + (N21 \cdot N31 \cdot \overline{Z}1) \cdot \overline{I}_d + \overline{Z}wn \cdot (\overline{I}_{as} + \overline{I}_{bs} + \overline{I}_{cs})}{N21} \quad \text{(Eq. 32)}$$

$$\overline{U}_{cp} = \frac{\overline{U}_{cs}}{N21} + \frac{(\overline{Z}1 \cdot N21^2 + \overline{Z}2 + \overline{Z}ws) \cdot \overline{I}_{cs} + (N21 \cdot N31 \cdot \overline{Z}1) \cdot \overline{I}_d + \overline{Z}wn \cdot (\overline{I}_{as} + \overline{I}_{bs} + \overline{I}_{cs})}{N21} \quad \text{(Eq. 33)}$$

In case the secondary burden is delta connected, the neutral conductor impedance $\overline{Z}wn$ equals infinity as shown in FIG. 7. $\overline{Z}ws$=Wiring impedance of secondary circuit (in case the current measurement is not done at the terminals of the voltage transformer):

$$\overline{U}_{ap} = \frac{\overline{U}_{as}}{N21} + \frac{(\overline{Z}1 \cdot N21^2 + \overline{Z}2 + \overline{Z}ws) \cdot \overline{I}_{as} + (N21 \cdot N31 \cdot \overline{Z}1) \cdot \overline{I}_d}{N21} \quad \text{(Eq. 34)}$$

$$\overline{U}_{bp} = \frac{\overline{U}_{bs}}{N21} + \frac{(\overline{Z}1 \cdot N21^2 + \overline{Z}2 + \overline{Z}ws) \cdot \overline{I}_{bs} + (N21 \cdot N31 \cdot \overline{Z}1) \cdot \overline{I}_d}{N21} \quad \text{(Eq. 35)}$$

$$\overline{U}_{cp} = \frac{\overline{U}_{cs}}{N21} + \frac{(\overline{Z}1 \cdot N21^2 + \overline{Z}2 + \overline{Z}ws) \cdot \overline{I}_{cs} + (N21 \cdot N31 \cdot \overline{Z}1) \cdot \overline{I}_d}{N21} \quad \text{(Eq. 36)}$$

Where the following values are obtained, for example, from voltage transformer manufacturer or by measurements:
N21=N2/N1
N31=N3/N1
N1=Number of turns of wire in primary winding
N2=Number of turns of wire in secondary winding
N3=Number of turns of wire in tertiary winding
$\overline{Z}1$=Impedance of primary winding
$\overline{Z}2$=Impedance of secondary winding
$\overline{Z}3$=Impedance of tertiary winding The corrected secondary voltages can be derived by a well-known ratio conversion:

$$\overline{U}_{ascorr} = N21 \cdot \overline{U}_{ap}$$

$$\overline{U}_{bscorr} = N21 \cdot \overline{U}_{bp}$$

$$\overline{U}_{cscorr} = N21 \cdot \overline{U}_{cp}$$

Thus, according to an exemplary embodiment, when the secondary burden impedances are star-connected, the correction to the measured secondary voltages is applied on the basis of the impedance of the primary winding, the impedance of the secondary winding, the secondary wiring impedance, the secondary neutral conductor impedance, the secondary currents and the tertiary current, for example, according to equations 31-33.

In a similar manner, according to another exemplary embodiment, when the secondary burden impedances are delta-connected, the correction to the measured secondary voltages is applied on the basis of the impedance of the primary winding, the impedance of the secondary winding, the secondary wiring impedance, the secondary currents and the tertiary current e.g. according to equations 34-36.

Thus, by using the secondary currents measured from the secondary windings and the tertiary current measured from the tertiary windings in the correction, the burden impedance values, for example, are not needed.

Figure 8:
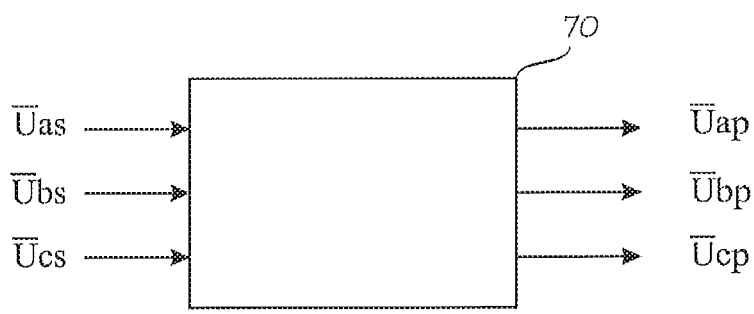
FIG. 8 shows an apparatus according to an exemplary embodiment of the present disclosure.
Figure 9:
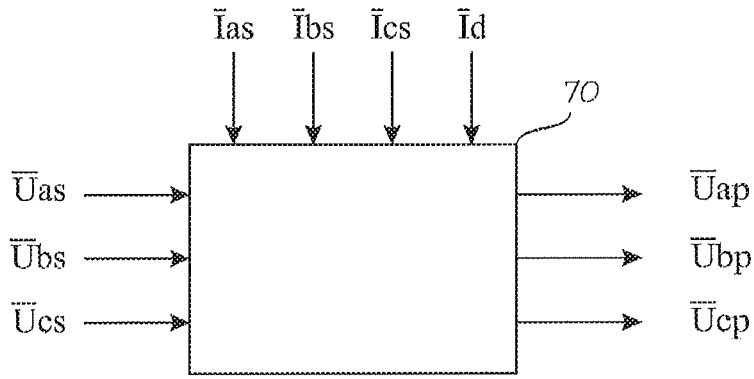
FIG. 9 shows an apparatus according to an exemplary embodiment of the present disclosure.

Also, the corrected value of residual voltage may be calculated by calculating the sum of the corrected voltages:

The corrected residual voltage on a primary voltage level= $\overline{U}_{0corr} = (\overline{U}_{ap} + \overline{U}_{bp} + \overline{U}_{cp})/3$ In case the ratio of the tertiary winding N3 to the primary winding N1 is N3/N1=1/sqrt(3), then the corrected residual voltage on a tertiary voltage level= $\overline{U}_{0corr} = (\overline{U}_{ap} + \overline{U}_{bp} + \overline{U}_{cp}) \cdot N31$ An apparatus according to any one of the above embodiments, or a combination thereof, may be implemented as one unit or as two or more separate units that are configured to implement the functionality of the various embodiments. Here the term 'unit' refers generally to a physical or logical entity, such as a physical device or a part thereof or a software routine. FIG. 8 illustrates an example of a device 70 that receives as inputs measured secondary voltages $\overline{U}_{as}$, $\overline{U}_{bs}$, $\overline{U}_{cs}$ and determines and outputs the values of the primary voltages $\overline{U}_{ap}$, $\overline{U}_{bp}$, $\overline{U}_{cp}$ applying the correction as described above in connection with equations 25-30, for example. The necessary parameters of the transformers and/or one or more parameters of the external wiring and/or burden that are used in the correction procedure may be stored in the device 70. Such parameters may be user definable via a suitable user interface (not shown) to the device 70, for example. FIG. 9 illustrates another example of the device 70 which in this embodiment further receives measured secondary currents $\overline{I}_{as}$, $\overline{I}_{bs}$, $\overline{I}_{cs}$ and tertiary current $\overline{I}_d$ as inputs and uses also them in the correction procedure as described above in connection with equations 31-36, for example. Device 70 may be part of the transformer configuration 11, 12, 13 or a separate entity.

An apparatus according to any one of the embodiments, such as device 70, may be implemented by means of a computer or corresponding digital signal processing equipment executing suitable software, for example. Such a computer or digital signal processing equipment may include at least a non-transitory computer-readable recording medium (e.g., a non-volatile memory such as a ROM, hard disk drive, flash memory, etc.) for tangibly recording software and/or program instructions, a working memory (RAM) providing storage area for arithmetical operations, and a central processing unit (CPU), such as a general-purpose digital signal processor. The CPU may include a set of registers, an arithmetic logic unit, and a control unit. The control unit is controlled by a sequence of program instructions transferred to the CPU from the RAM. The control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the present disclosure may also include suitable input means and output means. It is also possible to use a specific integrated circuit or circuits, and/or discrete components and devices for implementing the functionality according to any one of the embodiments.

The present disclosure can be implemented in existing system elements or by using separate dedicated elements or devices in a centralized or distributed manner. Present devices for electric systems may include processors and memory that can be utilized in the functions according to embodiments of the disclosure. Thus, all modifications and configurations required for implementing an embodiment of the disclosure, for example, in existing devices may be performed as software routines, which may be implemented as added or updated software routines. If the functionality of the present disclosure is implemented by a processor executing software recorded on a non-transitory computer-readable recording medium, such software can be provided as a computer program product including computer program code which, when run on a computer, causes the computer or a corresponding arrangement to perform the functionality according to the disclosure, as described above. Such a computer program code may be tangibly stored (recorded) or generally embodied on a computer readable medium, such as suitable memory, e.g. a flash memory or a disc memory from which it is loadable to the unit or units executing the program code. In addition, such a computer program code implementing the disclosure may be loaded to and recorded by the unit or units executing the computer program code via a suitable data network, for example, and it may replace or update a possibly existing program code.

It will be obvious to a person skilled in the art that, as the technology advances, the inventive concept can be implemented in various ways. The disclosure and its embodiments are not limited to the examples described above but may vary within the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for voltage measurement with a transformer configuration including three single pole voltage transformers each respectively having a primary winding, a secondary winding and a tertiary winding, wherein the primary windings are connected to primary voltages and the tertiary windings of the voltage transformers are open-delta connected with each other, the method comprising:
    measuring secondary voltages from the secondary windings; and
    determining values of the primary voltages on the basis of the secondary voltages measured from the secondary windings and a turns-ratio between the primary winding and the secondary winding, wherein the determining of the values of the primary voltages comprises:
    applying a correction to the measured secondary voltages on the basis of:
    at least one of (i) one or more parameters of the voltage transformers and (ii) one or more quantities in a known relation to one or more parameters of the voltage transformers,
    at least one of (iii) one or more parameters of a circuit connected to the secondary windings and (iv) one or more quantities in a known relation to one or more parameters of the circuit connected to the secondary windings, and
    at least one of (v) one or more parameters of a circuit connected to the tertiary windings and (vi) one or more quantities in a known relation to one or more parameters of the circuit connected to the tertiary windings.

2. The method of claim 1, wherein the parameters of the voltage transformers comprise an impedance of the primary winding, an impedance of the secondary winding, an impedance of the tertiary winding, a number of turns of wire in the primary winding, a number of turns of wire in the secondary winding, and a number of turns of wire in the tertiary winding.

3. The method of claim 1, wherein the parameters of the circuit connected to the secondary windings comprise at least one of:
   a secondary burden impedance; and
   a secondary wiring impedance.

4. The method of claim 3, wherein the parameters of the circuit connected to the secondary windings comprise a secondary neutral conductor impedance when the secondary burden impedances are star-connected.

5. The method of claim 1, wherein the parameters of the circuit connected to the tertiary windings comprise at least one of:
   a resistance of a tertiary damping resistor;
   a tertiary burden impedance; and
   a tertiary wiring impedance.

6. The method of claim 1, wherein the correction to the measured secondary voltages is applied, when the secondary burden impedances are star-connected, on the basis of the impedance of the primary winding, the impedance of the secondary winding, the secondary wiring impedance, the secondary neutral conductor impedance, secondary currents measured from the secondary windings, and a tertiary current measured from the tertiary windings.

7. The method of claim 1, wherein the correction to the measured secondary voltages is applied, when the secondary burden impedances are delta-connected, on the basis of the impedance of the primary winding, the impedance of the secondary winding, the secondary wiring impedance, secondary currents measured from the secondary windings and a tertiary current measured from the tertiary windings.

8. A non-transitory computer-readable recording medium having a computer program recorded thereon that, when executed, causes a processor of a computer processing device to carry out operations for voltage measurement with a transformer configuration including three single pole voltage transformers each respectively having a primary winding, a secondary winding and a tertiary winding, wherein the primary windings are connected to primary voltages and the tertiary windings of the voltage transformers are open-delta connected with each other, the operations comprising:
   measuring secondary voltages from the secondary windings; and
   determining values of the primary voltages on the basis of the secondary voltages measured from the secondary windings and a turns-ratio between the primary winding and the secondary winding, wherein the determining of the values of the primary voltages comprises:
   applying a correction to the measured secondary voltages on the basis of:
   at least one of (i) one or more parameters of the voltage transformers and (ii) one or more quantities in a known relation to one or more parameters of the voltage transformers,
   at least one of (iii) one or more parameters of a circuit connected to the secondary windings and (iv) one or more quantities in a known relation to one or more parameters of the circuit connected to the secondary windings, and
   at least one of (v) one or more parameters of a circuit connected to the tertiary windings and (vi) one or more quantities in a known relation to one or more parameters of the circuit connected to the tertiary windings.

9. An arrangement for voltage measurement with a transformer configuration including three single pole voltage transformers each respectively having at least a primary winding, a secondary winding and a tertiary winding, wherein the primary windings are arranged to be connected to primary voltages, and the tertiary windings of the voltage transformers are open-delta connected with each other, the arrangement comprising:
   means for determining values of the primary voltages on the basis of secondary voltages measured from the secondary windings and a turns-ratio between the primary winding and the secondary winding,
   wherein the means for determining the values of the primary voltages are configured to apply a correction to the measured secondary voltages on the basis of:
   at least one of (i) one or more parameters of the voltage transformers and (ii) one or more quantities in a known relation to one or more parameters of the voltage transformers,
   at least one of (iii) one or more parameters of a circuit connected to the secondary windings and (iv) one or more quantities in a known relation to one or more parameters of the circuit connected to the secondary windings, and
   at least one of (v) one or more parameters of a circuit connected to the tertiary windings and (vi) one or more quantities in a known relation to one or more parameters of the circuit connected to the tertiary windings.

10. The arrangement of claim 9, wherein the parameters of the voltage transformers comprise an impedance of the primary winding, an impedance of the secondary winding, an impedance of the tertiary winding, a number of turns of wire in the primary winding, a number of turns of wire in the secondary winding, and a number of turns of wire in the tertiary winding.

11. The arrangement of claim 9, wherein the parameters of the circuit connected to the secondary windings comprise at least one of:
   a secondary burden impedance; and
   a secondary wiring impedance.

12. The arrangement of claim 11, wherein the parameters of the circuit connected to the secondary windings comprise a secondary neutral conductor impedance when the secondary burden impedances are star-connected.

13. The arrangement of claim 9, wherein the parameters of the circuit connected to the tertiary windings comprise at least one of:
   a resistance of a tertiary damping resistor;
   a tertiary burden impedance; and
   a tertiary wiring impedance.

14. The arrangement of claim 9, wherein the means for determining the values of the primary voltages are configured to apply the correction to the measured secondary voltages, when the secondary burden impedances are star-connected, on the basis of the impedance of the primary winding, the impedance of the secondary winding, the secondary wiring impedance, the secondary neutral conductor impedance, secondary currents measured from the secondary windings and a tertiary current measured from the tertiary windings.

15. The arrangement of claim 9, wherein the means for determining the values of the primary voltages are arranged to apply the correction to the measured secondary voltages, when the secondary burden impedances are delta-connected, on the basis of the impedance of the primary winding, the impedance of the secondary winding, the secondary wiring impedance, secondary currents measured from the secondary windings and a tertiary current measured from the tertiary windings.

16. The arrangement of claim 9, comprising:
the transformer configuration.

17. An apparatus for voltage measurement with a transformer configuration including three single pole voltage transformers each respectively having at least a primary winding, a secondary winding and a tertiary winding, wherein the primary windings are arranged to be connected to primary voltages, and the tertiary windings of the voltage transformers are open-delta connected with each other, the apparatus being configured to:

determine values of the primary voltages on the basis of secondary voltages measured from the secondary windings and a turns-ratio between the primary winding and the secondary winding; and apply a correction to the measured secondary voltages, when determining the values of the primary voltages, on the basis of:

at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

18. An apparatus for voltage measurement with a transformer configuration comprising three single pole voltage transformers each having at least a primary winding, a secondary winding and a tertiary winding, wherein the primary windings are arranged to be connected to primary voltages and the tertiary windings of the voltage transformers are open-delta connected with each other, the apparatus comprising:

a processor; and
a memory storing instructions that, when executed by the processor, cause the apparatus to:
determine values of the primary voltages on the basis of the secondary voltages measured from the secondary windings and a turns-ratio between the primary winding and the secondary winding; and apply a correction to the measured secondary voltages, when determining the values of the primary voltages, on the basis of:

at least one of (i) one or more parameters of the voltage transformers and (ii) one or more quantities in a known relation to one or more parameters of the voltage transformers, at least one of (iii) one or more parameters of a circuit connected to the secondary windings and (iv) one or more quantities in a known relation to one or more parameters of the circuit connected to the secondary windings, and at least one of (v) one or more parameters of a circuit connected to the tertiary windings and (vi) one or more quantities in a known relation to one or more parameters of the circuit connected to the tertiary windings.

* * * * *